United States Patent [19]
Yamaguchi

[11] Patent Number: 5,981,149
[45] Date of Patent: Nov. 9, 1999

[54] METHOD FOR MANUFACTURING SEMICONDUCTOR DEVICE

[75] Inventor: Atsumi Yamaguchi, Tokyo, Japan

[73] Assignee: Mitsubishi Denki Kabushiki Kaisha, Tokyo, Japan

[21] Appl. No.: 08/883,000

[22] Filed: Jun. 26, 1997

[30] Foreign Application Priority Data

Dec. 4, 1996 [JP] Japan ................... 8-324031

[51] Int. Cl.⁶ ............................ G03F 7/00
[52] U.S. Cl. ............... 430/316; 430/313; 430/317; 430/318; 430/396
[58] Field of Search .................. 430/312, 313, 430/314, 394, 396, 317, 318

[56] References Cited

U.S. PATENT DOCUMENTS

| | | | |
|---|---|---|---|
| 5,728,618 | 3/1998 | Tseng | 438/253 |
| 5,753,417 | 5/1998 | Ulrich | 430/312 |
| 5,856,067 | 1/1999 | Gabbrielli et al. | 430/311 |

FOREIGN PATENT DOCUMENTS 63-313866  12/1988  Japan .

*Primary Examiner*—John A. McPherson
*Attorney, Agent, or Firm*—Oblon, Spivak, McClelland, Maier & Neustadt, P.C.

[57] ABSTRACT

When a resist pattern used to manufacture a semiconductor integrated circuit element is formed, high alignment precision can be achieved. A method for manufacturing a semiconductor device comprises the steps of: irradiating exposure light onto a resist film coated on a substrate to be etched via a photomask on which at least a first opening pattern and a second opening pattern are formed to thereby expose the resist film; developing the resist film to thereby obtain a resist pattern; etching away the substrate while using the resist pattern as an etching mask to thereby obtain a predetermined pattern; and removing the resist pattern; wherein when the exposure light has first exposure intensity, the predetermined pattern obtained at the step is a pattern corresponding to the first opening pattern and a pattern corresponding to the second opening pattern; and when the exposure light has second exposure intensity, the predetermined pattern obtained at the step is only a pattern corresponding to the second opening pattern.

12 Claims, 21 Drawing Sheets

_5,981,149_

METHOD FOR MANUFACTURING SEMICONDUCTOR DEVICE

BACKGROUND OF THE INVENTION

1. Field of the Invention

The present invention generally relates to a method for manufacturing a semiconductor device. More specifically, the present invention is directed to a resist pattern forming method used in manufacturing of a semiconductor integrated circuit element, and in particular, to a resist pattern forming method capable of effectively achieving high alignment precision by drawing a wiring pattern and a contact hole pattern on the same photomask (reticle) and by using this photomask several times to perform an exposing process.

2. Description of the Related Art

Very recently, when semiconductor integrated circuits (semiconductor devices) are manufactured, underlayers such as semiconductor substrates are selectively processed by executing etching processes and ion implantations. In this case, in order to selectively protect non-processed portions of the underlayers, patterns of composite materials being photosensed by active light rays such as ultraviolet rays, X-rays, and electron beams, so-called "photosensitive resist film" (will be referred as "resist" hereinafter) are formed on the underlayers.

In the most general method for forming the resist patterns, the ultraviolet ray irradiating method is employed by using the reduced projection exposing apparatus (stepper) in which the light source is constructed of g-ray (wavelength= 436 nm) of a mercury lamp, i-ray (wavelength=365 nm), or KrF excimer laser light (wavelength=248 nm).

In the stepper, the photomask is mounted to execute the exposing process. This photomask is called as a "reticle" in which a circuit pattern is formed on a glass substrate by a shield film such as chromium(Cr). During the exposing operation, precise positioning (alignment) must be carried out in order that the mutual positional relationship between the photomask and the previously formed circuit pattern on the substrate.

The pattern drawn on the photomask is reduced through the lens and transferred to the resist film coated on the semiconductor substrate. Thereafter, this resist film is developed, so that the resist pattern can be formed.

There are a positive type resist and a negative type resist. The positive type resist is such a resist that a light irradiated portion is soluble by a developing fluid, but a light non-irradiated portion is insoluble. The negative type resist is such a resist that a light irradiated portion is not insoluble by a developing fluid, but a light non-irradiated portion is soluble.

To manufacture a semiconductor integrated circuit device, this resist pattern forming stage is normally required 20 to 30 times.

Currently, semiconductor integrated circuits are rapidly integrated in high degrees and are made with high performance. In connection with this trend, strong demands are further made by that the circuit patterns are made narrower. As an example of a DRAM (dynamic random access memory), a resist pattern with a level of 0.4 $\mu$m is drawn in 16 Mbits DRAM manufactured in mass production. In this photolithography stages, i-rays among ultraviolet rays are mostly utilized. Also, resist patterns with levels of 0.35 to 0.30 $\mu$m are required in 64 Mbits DRAM under transition stage from trial to mass production. Further, resist patterns with levels smaller than 0.25 $\mu$m are required in 256 Mbits DRAM and 1 Gbit DRAM under developing/examination trial stages. It is conceivable that KrF excimer laser light can be effectively utilized. Also, the dimension precision and the alignment precision must be increased in conjunction with fine widths of patterns.

For instance, in a semiconductor device having a level related to 256 Mbits DRAM, the dimension control of approximately ±0.03 $\mu$m is required, and the alignment precision of approximately 0.06 $\mu$m is required with respect to the respective stages. This dimensional requirement may be more strictly required in future.

The factors of the alignment precision deterioration are caused by magnification errors in an exposure lens, rotation errors occurred between a reticle and a chip formed on a wafer, and errors occurred during alignment measurements. Each of the precision may be gradually increased by improving the performance of the lens and the wafer stage of the exposing apparatus, and the performance of the alignment measuring apparatus.

Then, when the required precision of the alignment error is strictly increased, the reticle manufacturing error cannot be neglected. Moreover, when the integration degree is increased, the drawing area and the figure data number are increased. Therefore, the time required to draw the patterns by the electron beams (EB) is greatly prolonged during the reticle manufacture. The errors produced when the reticle is manufactured can be hardly suppressed due to such adverse influences by coating the resist, developing the resist, and by the surface uniform characteristic of the etching process.

Next, a description will now be made of the conventional pattern forming method with employment of a single reticle per one step.

First, in FIG. 58A, there is shown a first reticle (photomask) 101 used when a pattern of a contact hole is exposed. Within this first reticle 101, a contact hole pattern 102 is drawing by electron beams to be formed. Also, in FIG. 58B, there is represented a second reticle 103 used when patterns of a wiring line electrically connected to a contact and of other wiring lines are exposed. In this second reticle 103, wiring patterns 104a and 104b are formed by a light shielding portion. A width of a portion of the wiring pattern 104a becomes wide among these wiring patterns. This wide portion is a connection portion with a contact, and is designed to be a large dimension due to an allowance.

Next, one example of the method for manufacturing the semiconductor device is represented. In this method, as shown in FIG. 59, a stacked insulating film 107 is opened in an active region 106 on a surface of a semiconductor substrate 105. The following description is made of such cases that a contact 108 is formed so as to be buried within the opening, an upper layer wiring line 109 in contact with this contact 108 is formed, and a wiring line 109b is formed on the insulating film 107.

First, as illustrated in FIG. 60, a silicon oxide film 107 having a thickness of on the order of 5000 Å is stacked on the semiconductor substrate 105 on which the active region 106 is partially formed. Next, the commercially available positive type resist film having a thickness of on the order of 5000 Å is coated. Then, an exposing process is carried out be employing a KrF excimer laser (wavelength being 248 nm) 111 as a light source via a first reticle 101 on which the contact hole pattern 102 shown in FIG. 58A is formed.

Exposure energy required in this exposing process is 60 mj/cm$^2$.

Next, as indicated in FIG. 61, the baking process (PEB) is performed after the exposing process for 90 seconds under temperature of 110° C., and then the developing process is carried out for 60 seconds by using a 2.38 weight % solution of tetrametyle alchole ammonium hydroxide (TMAH). Thus, a resist pattern 110b having an opening portion 110a is obtained.

Thereafter, as indicated in FIG. 62, while using the resist pattern 110b as an etching mask, the anisotropic etching process is carried out with respect to the silicon oxide film 107, so that a contact hole 108a is formed. At this stage, the active region 106 formed on the surface of the semiconductor substrate 1 may be made as a low resistance value by previously implanting the impurity ions.

Thereafter, as shown in FIG. 63, the resist pattern 110b is removed by way of the oxygen plasma ashing method. It should be understood that the above-described ion implanting operation may be carried out at this stage.

Next, as shown in FIG. 64, a metal wiring material 109 such as tungsten silicide ($WSi_2$) is stacked with having a thickness of approximately 1000 Å by way of the sputtering method, or the CVD (chemical vapor deposition) method. At this time, the contact hole 108a is filled with the metal wiring material 109 to form the contact 108.

Thereafter, as shown in FIG. 65, a positive type resist film 112 is coated on the entire surface of the metal wiring material. Then, the exposing process is carried out by employing the KrF excimer laser stepper via the second reticle 103 on which the wiring patterns 104a and 104b are drawn, as shown in FIG. 58B. At this time, the necessary exposure energy is 35 mj/cm$^2$.

Next, as indicated in FIG. 66, the PEB process and the developing process are carried out to thereby form a resist pattern 112a. A portion from which the photoresist has been removed by the developing process is used as an opening portion 112b.

Thereafter, as shown in FIG. 67, while using the resist pattern 112a as an etching mask, the anisotropic etching operation is carried out with respect to the metal wiring material 109. Then, the metal wiring material 109 is formed into predetermined wiring lines 109a and 109b.

Next, the resist pattern 112a is removed, so that a semiconductor device as shown in FIG. 59 can be manufactured.

In such a case that the patterns are formed in accordance with the above-described manner, since the semiconductor device is manufactured by employing two sets of the reticles, namely the first reticle 101 on which the contact hole pattern 102 is formed, and the second reticle 103 on which the wiring pattern 104 is formed, there are adverse influences caused by the manufacturing errors of the reticles. In other words, the reticles on which the patterns are drawn by the electron beams are adversely influenced when the patterns are drawn due to the following factors, namely, the stage precision of the EB drawing apparatus, the positional precision of the beams under scanning, the temperatures in the apparatus, the adhesive conditions of the deposited articles within the column of the apparatus, the bend of the blanks (glass substrate) of the reticles, and the like. Therefore, the positional precision of the patterns drawn on the reticles is deteriorated.

Accordingly, when this conventional method is used to manufacture, for instance, the semiconductor device with the level of 256 Mbits DRAM, the alignment error caused by the manufacturing errors between the reticles becomes on the order of 10 to 20 nm on the wafer.

FIG. 68 represents a positional relationship between the contact 108 and the wiring line 109a in such a case that the alignment error occurs during the photolithography. In FIG. 68, symbol $X_1$ indicates a region where an opening pattern should be originally arranged, and symbol $X_2$ shows a region occupied by the opening pattern when the alignment error occurs. A shift between $X_1$ and $X_2$ denotes a portion indicated by a symbol $Y_1$. As shown in FIG. 68, when the wiring line is patterned under such a condition that the alignment error occurs, such a wiring line containing a pattern shift $Y_2$ (see FIG. 69) would be eventually formed.

Although the pattern shift $Y_2$ is produced along the sectional direction in this example, other various cases may be conceived, for example, the pattern shift is produced along the longitudinal direction. Since such a pattern shift is produced, the matching characteristic with respect to the pattern in the upper layer is deteriorated. Therefore, this may cause the contact failure and the shortcircuits in the wiring lines.

As another conventional method, Japanese Unexamined Paten Publication No.63-313866 discloses the method for forming the resist patterns with the different shapes by employing the same reticle (photomask) on which the patterns having the different sizes are drawn.

According to this conventional method, one resist pattern forming method is similar to the normal resist pattern forming method such that the exposing process is carried out with respect to the resist film via one sheet of the reticle, and the developing process is performed to thereby obtain the resist pattern. Another method for forming the resist patterns with the different shapes is accomplished by that after the above-explained normal resist pattern has been formed by using the same reticle, the thermal process at a preselected temperature is carried out so as to deform (thermally melt) the resist. The resist is caused to flow into a narrow interval (space) portion between the resist patterns to thereby fill the opening portion. To the contrary, as to a wide interval portion between the resist patterns, this opening condition is maintained. Then, only the large pattern (namely, pattern having large area) is formed. After the normal resist pattern is formed, the shapes of the resist patterns are made different by performing either the thermal process or not performing the thermal process.

However, in such a case that the resist pattern is deformed so as to vary the shapes of the resist pattern, the dimensions of the finally obtained resist patterns are slightly fluctuated by the film thickness of the resist film, and the changes in the temperature. Such a problem is conceivable that the process operation can be hardly performed in high precision.

SUMMARY OF THE INVENTION

As previously described, the conventional resist pattern forming methods own the following difficulties. That is, in semiconductor devices which will require higher alignment precision, a ratio of the photomask (reticle) manufacturing error to the alignment shift produced between the resist patterns located in the upper and lower layers would become large. As a consequence, such a pattern forming method is strongly required that the reticle manufacturing error should be reduced as much as possible, and the adverse influences caused by the reticle manufacturing error should be suppressed when the resist pattern is formed.

Therefore, a method for manufacturing a semiconductor device, according to the present invention comprises the steps of: irradiating exposure light onto a resist film coated on a substrate to be etched via a photomask on which at least a first opening pattern and a second opening pattern are formed to thereby expose the resist film; developing the resist film to thereby obtain a resist pattern; etching away the substrate while using the resist pattern as an etching mask to thereby obtain a predetermined pattern; and removing the resist pattern; wherein when the exposure light has first exposure intensity, the predetermined pattern obtained at the step is a pattern corresponding to the first opening pattern and a pattern corresponding to the second opening pattern; and when the exposure light has second exposure intensity, the predetermined pattern obtained at the step is only a pattern corresponding to the second opening pattern.

DETAILED DESCRIPTION OF THE PREFERRED EMBODIMENTS

First Embodiment

Figure 1:
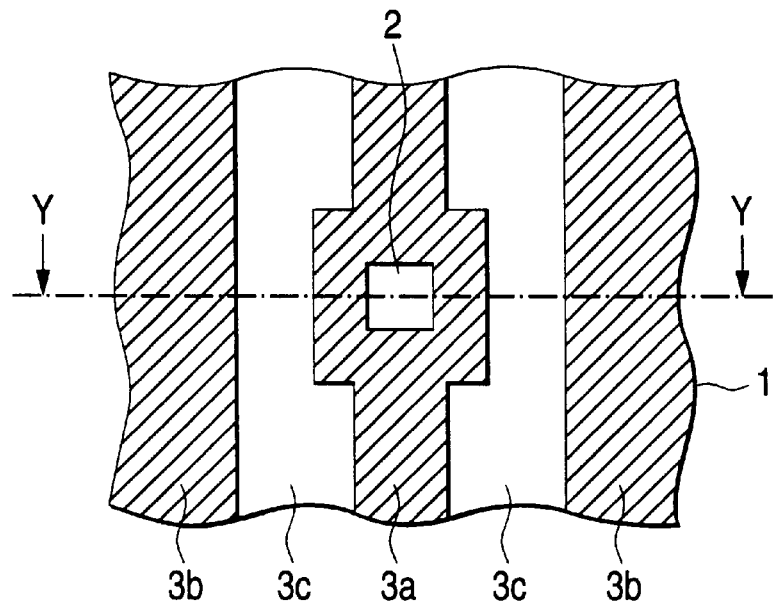
FIG. 1 is a plan view for schematically showing a reticle employed to manufacture a semiconductor device according to the present invention.

FIG. 1 is a plan view schematically showing one piece of reticle (photomask) 1 used in a photolithography process stage of a method for manufacturing a semiconductor device according to a first embodiment of the present invention. In FIG. 1, a contact hole pattern 2 formed by an opening portion, and wiring patterns 3a, 3b formed by light shielding portions are drawn on the reticle 1. Among these wiring patterns 3a and 3b, a wiring width of the wiring pattern 3a located in contact with the contact hole pattern 2 is made wider than that of the other wiring pattern 3b at a connection portion (contact cover portion) in order to increase the connection allowance. As to dimensions, the dimension of the contact hole pattern 2 is selected to be 0.24 μm in square; the width of the wiring pattern 3a is selected to be 0.48 μm; and the width of the other wiring pattern 3b is selected to be on the order of 0.24 μm. An opening portion 3c is formed between the wiring patterns 3a and 3b, and an area occupied by this opening portion 3c is made larger than that of the contact hole pattern 2.

Figure 2:
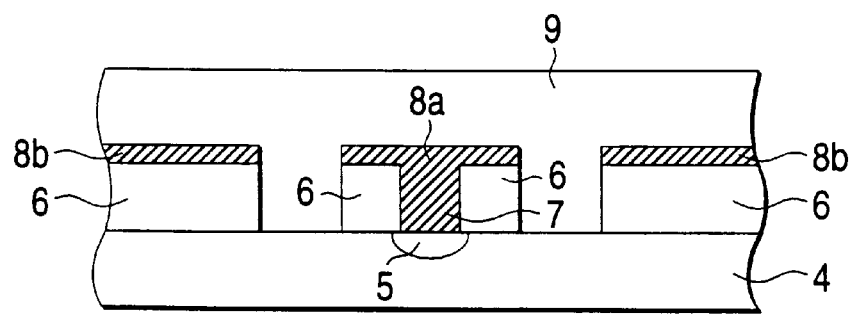
FIG. 2 is a sectional view for schematically indicating a semiconductor device according to a first embodiment of the present invention.

With employment of the above-described reticle 1, such a semiconductor device having a sectional structure as shown in FIG. 2 is manufactured. It should be understood that sectional views shown in FIG. 2 and the succeeding drawings are taken along a line Y—Y of the reticle 1 indicated in FIG. 1.

In FIG. 2, reference numeral 4 indicates a semiconductor substrate, reference numeral 5 denotes an active region formed on a surface of the semiconductor substrate 1 by diffusing, or implanting an impurity, and reference numeral 6 shows an insulating film made of a silicon oxide film. Reference numeral 7 shows a contact formed in such a manner that a portion of this insulating film 6 is selectively opened and a conductive substance fills inside this opening, reference numeral 8a shows a wiring line being electrically contact with the contact 7, and reference numeral 8b denotes a wiring line formed/arranged on the surface of the insulating film 6. An insulating substance 9 is stacked on these wiring lines 8a and 8b. This insulating substance 9 is formed in such a manner that a portion of this insulating substance 9 is made contact with the semiconductor substrate 4, and this insulating substance 9 electrically separates the wiring line 8a from the wiring line 8b.

Figure 3:
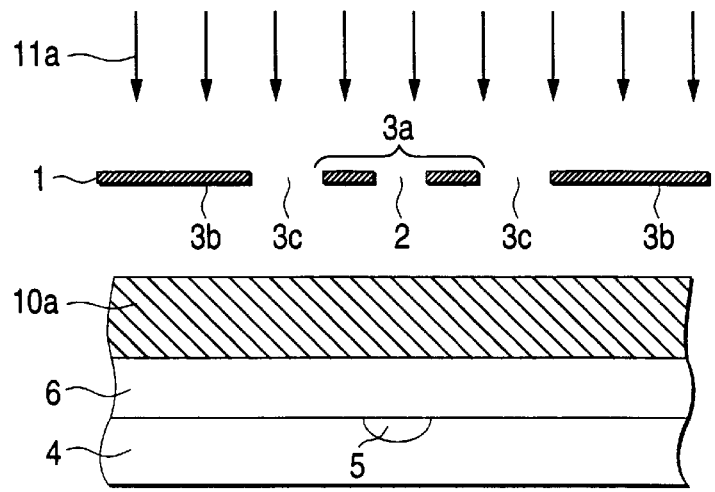
FIGS. 3 to 11 represent manufacturing stage diagrams of the semiconductor device according to the first embodiment of the present invention.

Referring now to FIG. 2, a method for manufacturing the semiconductor device shown in FIG. 2 will be explained. First, as shown in FIG. 3, the insulating film 6 made of a silicon oxide film having a thickness of 5000 Å (angstrom) is stacked on the semiconductor substrate 4 of the region under the contact 7, in which the active region 5 has been formed by implanting, or diffusing the impurity. Furthermore, a positive type resist film 10a having a thickness of on the order of 6000 Å is coated on the insulating film 6. Next, the exposing process is carried out via the reticle 1 by employing a KrF excimer laser, and all of the contact hole 2 and the wiring patterns 3a, 3b shown in FIG. 1 are drawn on the reticle 1. At this time, exposing energy is selected to 60 mj/cm$^2$. It should be noted that although the active region 5 has been formed at the step before the insulating film 6 is formed in the above example, this active region 5 may be formed in other steps.

Figure 4:
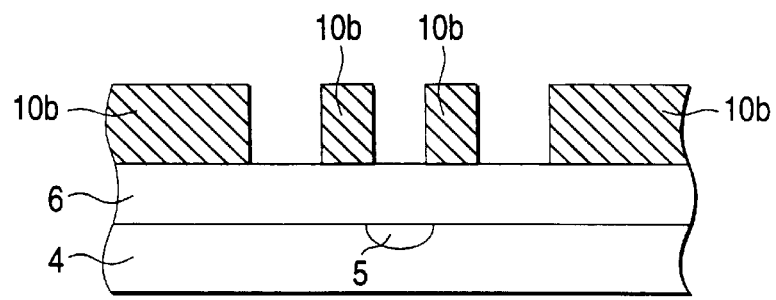

Next, as indicated in FIG. 4, the baking process (PEB) is performed for 90 seconds under temperature of 110° C., and the developing process is carried out for 60 seconds by using a 2.38 weight % solution of tetrametyle alchole ammonium hydroxide (TMAH). Thus, only a photosensitive portion of a positive type resist film 10a is removed and the remaining portions are left to thereby form a resist pattern 10b.

Figure 5:
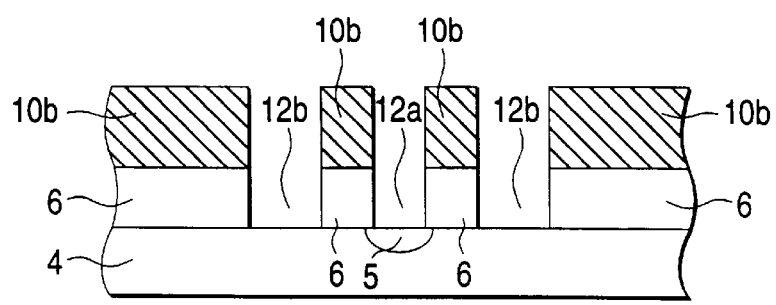
Figure 6:
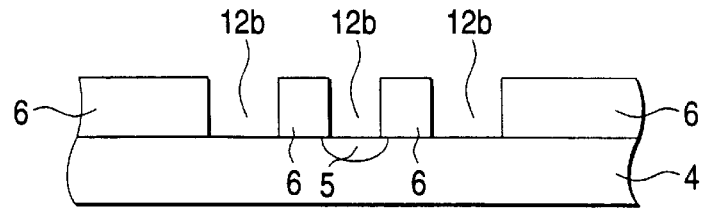

Thereafter, as indicated in FIG. 5, while using the resist pattern 10b as an etching mask, the anisotropic etching process is carried out with respect to the insulating film 6 so as to process this insulating film 6 in accordance with the shape of the resist pattern 10b, so that a contact hole 12a and an opening portion 12b are formed respectively. After this etching process, as shown, the resist pattern 10b is removed by way of the oxygen plasma ashing method.

Figure 7:
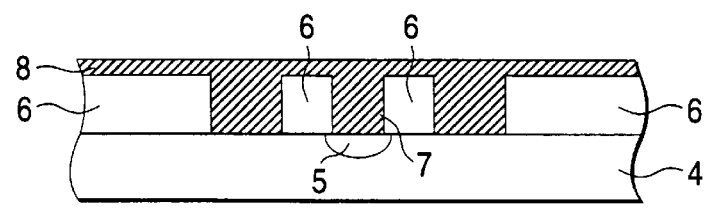

Next, as shown in FIG. 7, a metal wiring material 8 such as tungsten silicide (WSi$_2$) is stacked with having a thickness of approximately 1000 Å by way of the sputtering method, or the CVD (chemical vapor deposition) method. At this time, the contact hole 12a is filled with the metal wiring material 8 to form the contact 7. Also, the opening portion 12b is filled with the metal wiring material 8.

Figure 8:
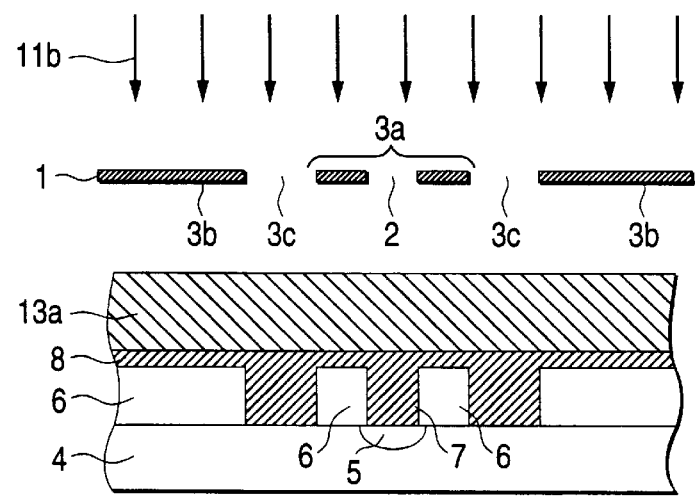

Thereafter, as shown in FIG. 8, a positive type resist film 13a having a thickness of on the order of 6000 Å is coated on the surface of the metal wiring material 8. Then, the reticle 1 used in the exposure stage of FIG. 3 is again used to perform the exposing process in intensity of exposure energy 35 mj/cm$^2$ by employing the KrF excimer laser 11b.

Figure 9:
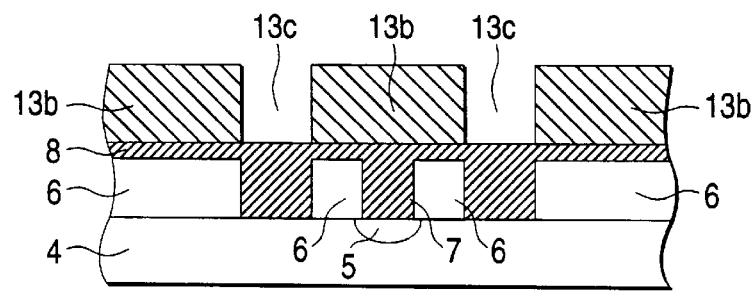

Next, as indicated in FIG. 9, the PEB process and the developing process are carried out to thereby form a resist pattern 13b. A portion from which the photoresist has been removed by the developing process is used as an opening portion 13c.

In this case, similar to the first exposing process (FIG. 3), the exposure energy must be selected to be on the order of 60 mj/cm$^2$ in order to obtain a resist pattern having a contact hole shape. Under such exposure energy of on the order of 35 mj/cm$^2$, the resist corresponding to the portion of the contact hole pattern 2 is not opened. As indicated in FIG. 9, the positive type resist film 13a above the contact 7 is not removed to be accordingly left.

As easily seen from FIG. 2 corresponding to the plan view of the reticle 1, the contact hole pattern 2 is an opening pattern shaped with a square of 0.24 μm, and owns a smaller area ratio of that of the opening portion 3c which is located in a space between the wiring patterns 3a and 3b formed by the light shielding portion. In the case that the exposure energy is low, this contact hole pattern 2 can be hardly photosensed. Since this nature is utilized, it is possible to determine as to whether or not the shape of the contact hole pattern 2 is left by selectively employing such a case that the exposure energy is set to 60 mj/cm$^2$, or another case that the exposure energy is set to 35 mj/cm$^2$.

Figure 10:
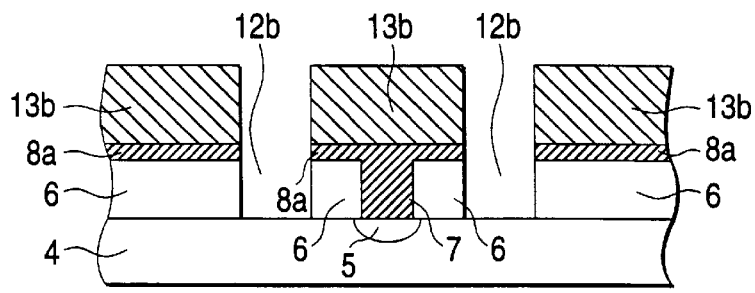

Next, as shown in FIG. 10, while using the resist pattern 13b as an etching mask, the anisotropic etching process is carried out with respect to the metal wiring material 8 so as to again form the opening portion 12b, so that a surface of the semiconductor substrate 4 is partially exposed. With this etching process, the metal wiring material 8 stacked on the insulating film 76 is formed in the shapes of the wiring lines 8a and 8b.

Figure 11:
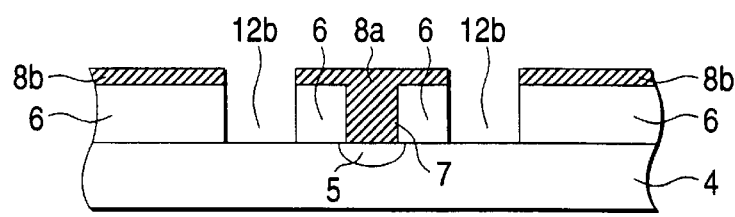

Thereafter, as indicated in FIG. 11, the resist pattern 13b is removed by way of the oxygen plasma ashing method.

Next, the insulating substance 9 made of a silicon oxide film having a thickness of on the order of 5000 Å is stacked by way of the CVD method, or the sputtering method so as to fill the inside of the opening portion 12b. Furthermore, the surfaces of the wiring lines 8a and 8b are covered with this insulating substance 9, so that such a semiconductor device as shown in FIG. 2 can be obtained.

Although other various process operations should be carried out, e.g., a step for further forming a wiring pattern on the upper larger when the actual semiconductor device is formed, detailed descriptions thereof are omitted.

As represented in this first embodiment, when the semiconductor device is formed, the wiring patterns 3a, 3b, and the contact hole pattern 2 are formed with employing only one reticle 1. As a consequence, the alignment error caused by the manufacturing error of the reticle can be avoided and the pattern shifts can be suppressed, as compared with such a case that a plurality of reticles are employed.

In this first embodiment, there is another effect that a total number of reticles employed in manufacturing of the semiconductor device can be reduced, as compared with that of the prior art, and thus, the manufacturing cost thereof can be further reduced.

Alternatively, as apparent from the foregoing descriptions, when the exposing process operations are performed in the different exposure intensity with employment of the same reticle to form two sorts of patterns, the optimum exposure intensity may be varied, depending upon the dimensions of the plural patterns formed in this reticle, and also the patterns to be formed are not limited to the wiring lines and the contact holes, but also other patterns.

Second Embodiment

Figure 12:
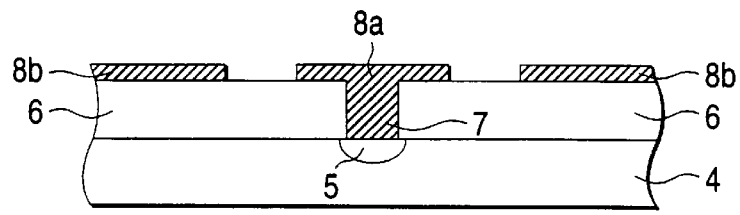
FIG. 12 is a sectional view for schematically indicating a semiconductor device according to a second embodiment of the present invention.

Next, a description will now be made of a semiconductor device manufacturing method according to second embodiment of the present invention. FIG. 12 schematically represents a sectional structure of the semiconductor device obtained by this second embodiment. As shown in FIG. 12, a contact 7 is formed on a semiconductor substrate 4 having an active region 5 selectively formed on a surface of this semiconductor substrate 4 in such a manner that the contact 7 is located in contact with this active region 5. A wiring line 8a is formed on an insulating film 6 for filling this contact 7 in such a manner that this wiring line 8a is located in contact with the contact 7, and another wiring line 8b is formed on another region of the insulating film 6.

The semiconductor device manufactured in accordance with this second embodiment owns a different structure from that of the semiconductor device manufactured in accordance with the above-described first embodiment. In the first embodiment, the opening portion 12b formed between the wiring lines 8a and 8b is filled at the same time when the insulating substance 9 is stacked on the wiring lines 8a and 8b. To the contrary, in the second embodiment, as indicated in FIG. 12, the insulating film 6 located at under portions of the wiring lines 8a and 8b is formed on the substantially entire surface of the semiconductor substrate 4, and the space portion between the wiring lines 8a and 8b is not filled with another insulating substance.

Figure 13:
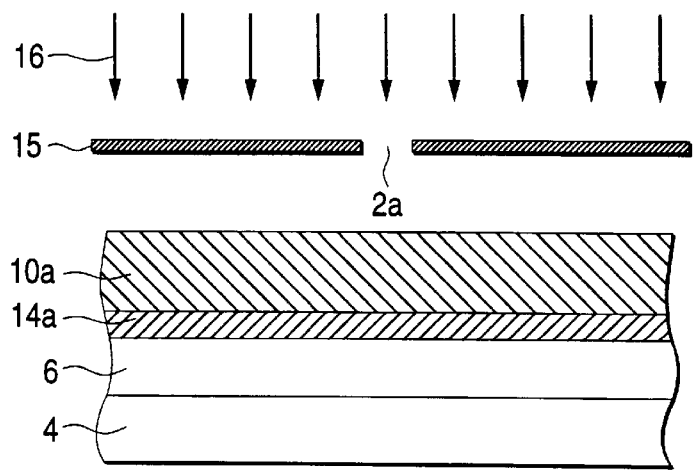
FIGS. 13 to 23 show manufacturing stage diagrams of the semiconductor device according to the second embodiment of the present invention.

Thereafter, a description will now be made of a method for manufacturing the semiconductor device having the structure shown in FIG. 12. First, as indicated in FIG. 13, the insulating film 6 made of a silicon oxide film having a thickness of 5000 Å is stacked on the semiconductor substrate 4, and further, a silicon nitride film 14a having a thickness from 500 Å to 1000 Å is stacked on this surface. Furthermore, a resist film 10a having a film thickness of on the order of 6000 Å is stacked on this surface. Exposure light 16 is irradiated to the resist film 10a via a second reticle 15 so as to perform the exposing process. In this second reticle 15, a contact hole pattern 2a is formed at a position corresponding to that of the contact hole pattern 2 formed in the reticle 1, and this contact hole pattern 2a has a larger dimension than that of the contact hole pattern 2.

Figure 14:
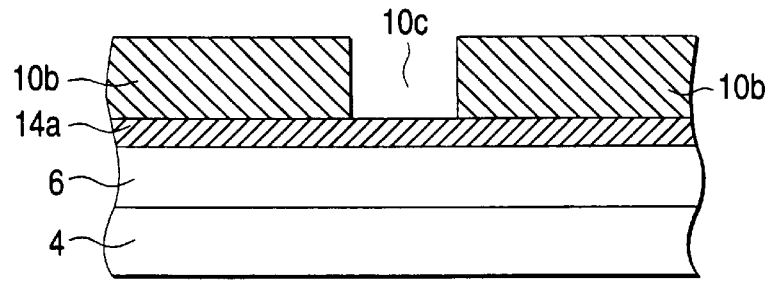

Thereafter, as indicated in FIG. 14, the developing process is carried out, and while the photosensed portion of the resist film 10a is removed, an opening portion 10c is formed and other portions are left as a resist pattern 10b.

Figure 15:
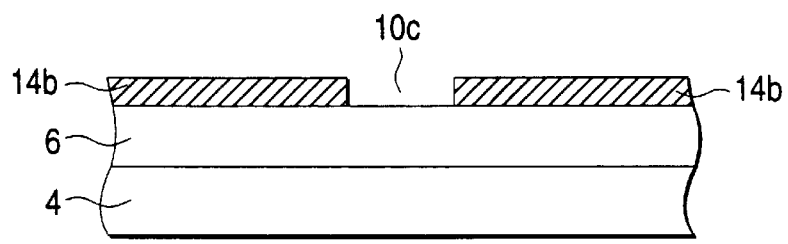

Subsequently, as shown in FIG. 15, while using the resist pattern 10b as an etching mask, the anisotropic etching process is carried out with respect to the silicon nitride film 14a, and then the opening portion 10c is dug and then is patterned, so that a nitride film pattern 14b is formed.

Figure 16:
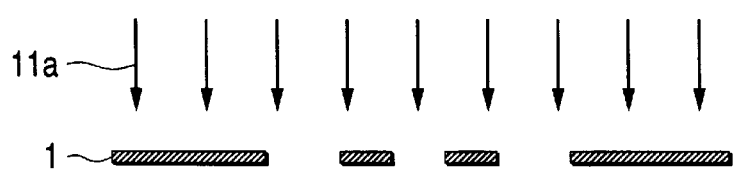
Figure 16:
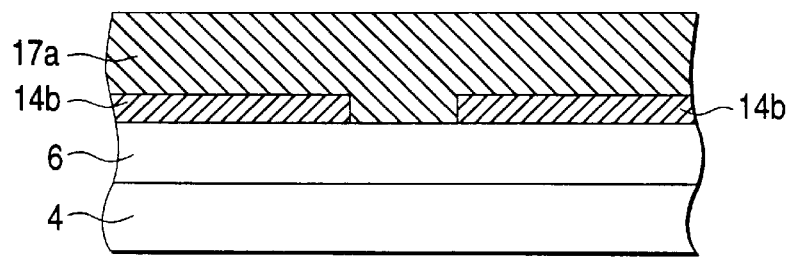

Thereafter, as shown in FIG. 16, a positive type resist film 17a is coated over the entire surface, and then KrF excimer laser 11a with exposure energy of 60 mj/cm$^2$ is irradiated thereon via the reticle 1 shown in FIG. 1 so as to expose the positive type resist film 17a.

Figure 17:
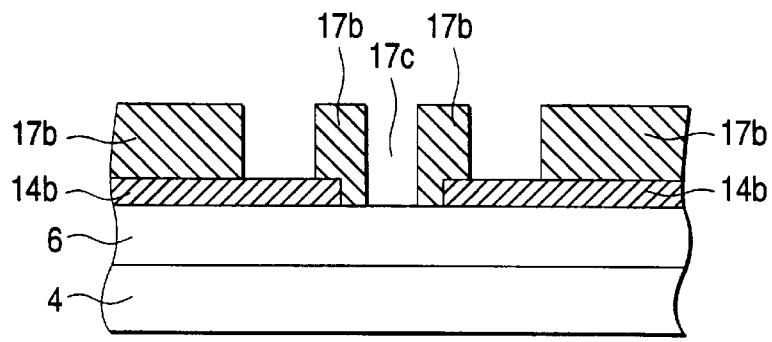

Then, as represented in FIG. 17, the developing process is performed, so that the photosensed portion in the positive type resist film 17a is selectively removed to thereby form a resist pattern 17b. Since the exposure energy at this time contains such energy that the shape of the contact hole pattern 2 on the reticle 1 can be exposed, the opening portion 3c between the wiring patterns 3a and 3b formed in the reticle 1, and an opening portion having a shape of the contact hole pattern 2 are formed after the developing process. Since the position where the opening portion 17c corresponding to the contact hole pattern 2 corresponds to the opening portion 10c of the nitride film pattern 14b, the insulating film 6 is being exposed from the bottom surface of the opening portion 17c.

Figure 18:
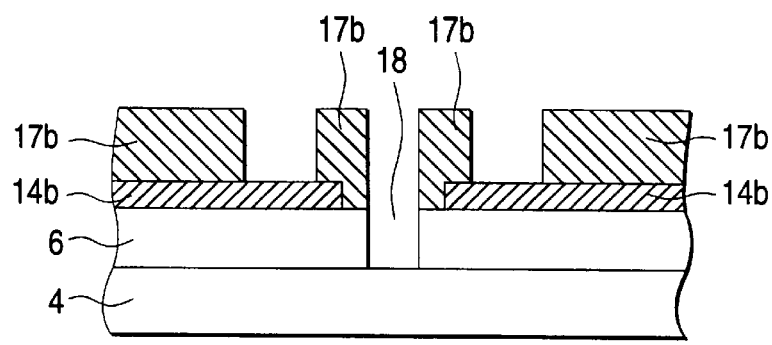

Next, as represented in FIG. 18, while using the resist pattern 17b as an etching mask, the anisotropic etching process is carried out so as to selectively etch away the insulating film 6, and the opening portion 17c is further dug to thereby form a contact hole 18. Since the nitride film pattern 14b may function as an etching stopper film, the bottom surface of other opening portion of the resist pattern 17b is not etched away.

Figure 19:
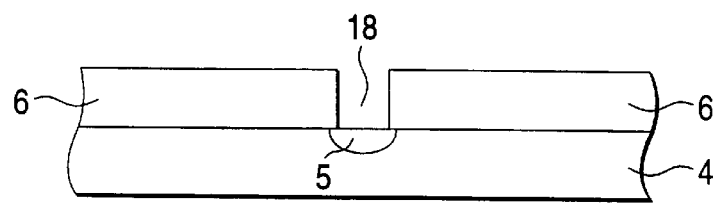

Thereafter, as represented in FIG. 19, the resist pattern 17b is removed and furthermore the nitride film pattern 14b is removed. At such a stage that before this resist pattern 17b and the nitride film pattern 14b are removed, or after the resist pattern 17b and the nitride film pattern 14b are removed, the impurity is implanted, so that the active region is formed in the surface of the semiconductor substrate 4 positioned at the bottom surface of the contact hole 18. It should be noted that this active region 5 may be previously formed before the insulating film 6 is formed.

Figure 20:
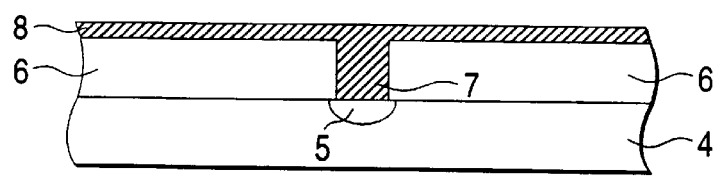

Next, as shown in FIG. 20, the metal wiring material 8 is stacked by way of the sputtering method or the CVD method in such a manner that the thickness of this stacked metal wiring material 8 becomes on the order of 1000 Å. At this time, the contact hole 18 is filled with the metal wiring material 8, so that the contact 7 is formed.

Figure 21:
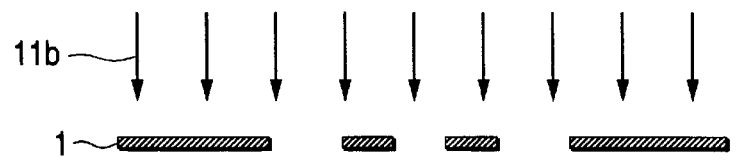

Thereafter, as illustrated in FIG. 21, a positive type resist film 19a is coated on an upper layer of the metal wiring material 8, and then the exposing process is carried out via the reticle 1 by employing the KrF excimer laser 11b having the exposure energy of 35 mj/cm$^2$.

Figure 22:
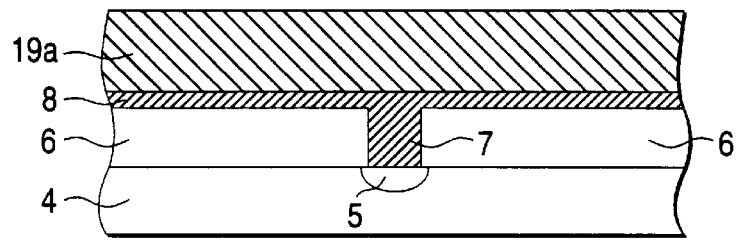

Next, since the developing process is carried out, as shown in FIG. 22, a resist pattern 19b is obtained. At this time, since the exposure energy is suppressed to the low energy value, no exposing operation is carried out due to a lack of light amounts as to a pattern having a small area such as the contact hole pattern 2. As a consequence, only an opening portion 19c corresponding to the opening portion 3c between the wiring lines 3a and 3b on the reticle 1 is formed.

Figure 23:
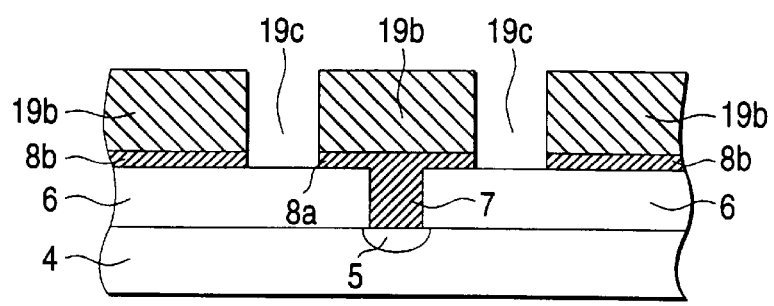

Thereafter, as indicated in FIG. 23, while using the resist pattern 19b as an etching mask, the anisotropic etching process is performed with respect to the metal wiring material 8, and the opening portion 19c is dug, and then the metal wiring material 8 is patterned on the wiring lines 8a and 8b.

Next, the resist pattern 19b is removed, so that the semiconductor device as shown in FIG. 12 is obtained.

Alternatively, it is conceivable that a second wiring line and a third wiring line may be further formed on the upper layer in addition to the structure of the semiconductor device shown in FIG. 12. However, descriptions thereof are omitted in this embodiment.

As previously described, in the case that the semiconductor device is formed in accordance with the method completely different from that of the first embodiment, since plural sorts of patterns are formed by employing only one sheet of the exposing reticle required for the alignment in essentially high precision, it is possible to avoid the alignment error caused by the reticle manufacturing error, as compared with that when only one sheet of the reticle is employed with respect to one sort of the pattern.

Third Embodiment

Figure 24:
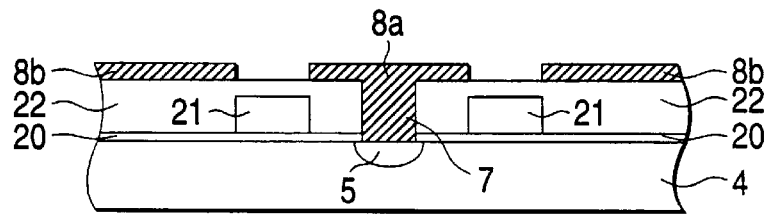
FIG. 24 is a sectional view for schematically representing a semiconductor device according to a third embodiment of the present invention.

Then, a semiconductor device manufacturing method according to a third embodiment of the present invention will now be described. A structure of a semiconductor device manufactured in accordance with the third embodiment is represented in FIG. 24. That is, a wiring line (lower layer wiring line) 21 is formed via a silicon oxide film 20 on a semiconductor substrate 4 where an active region 5 is formed in a surface thereof, and a wiring line (upper layer wiring line) 8a and another wiring line (upper layer wiring line) 8b which are electrically connected to a contact 7 are formed on a surface of an interlayer insulating film 22 for filling the contact 7 and the wiring line 21 formed on the active region 5.

Figure 25:
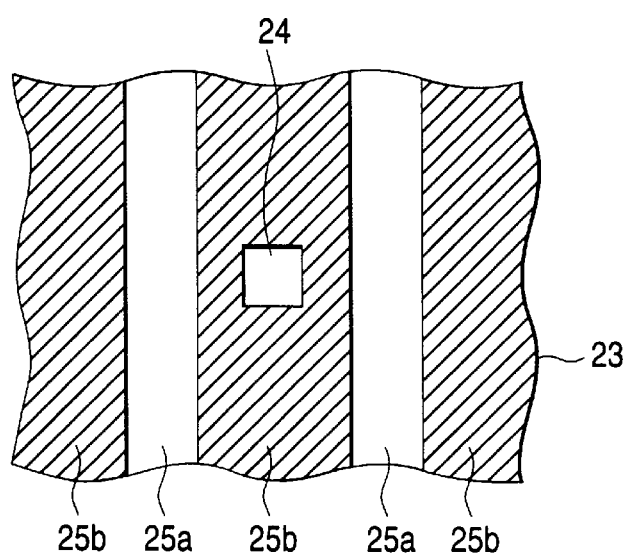
FIG. 25 is a plan view for showing a reticle used to manufacture a semiconductor device according to the present invention.

In this third embodiment, a reticle employed in the exposing process is illustrated in FIG. 25. That is, in this drawing, reference numeral 23 shows a reticle (plan view), reference numeral 24 indicates a contact hole pattern formed by the opening portion, reference numeral 25a shows a wiring pattern (lower layer wiring pattern) formed by the opening portion, and reference numeral 25b indicates a light shielding portion (upper layer wiring pattern).

Figure 26:
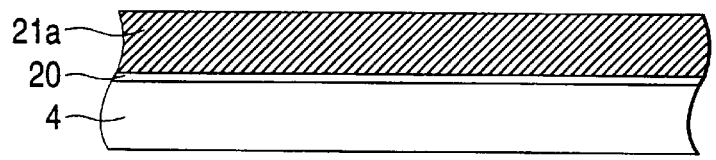
FIGS. 26 to 40 shows manufacturing stage diagrams of the semiconductor device according to the third embodiment of the present invention.

Subsequently, a method for manufacturing the semiconductor device shown in FIG. 24 will now be described in the manufacturing steps. As illustrated in FIG. 26, a silicon oxide film 20 having a film thickness of on the order of 100 Å is first stacked on the semiconductor substrate 4, and furthermore, a polysilicon film 21a having a film thickness of on the order of 1000 Å is stacked on the upper layer.

Figure 27:
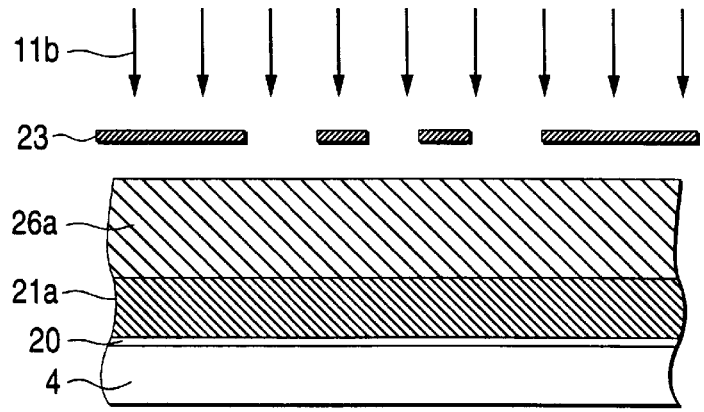
Figure 28:
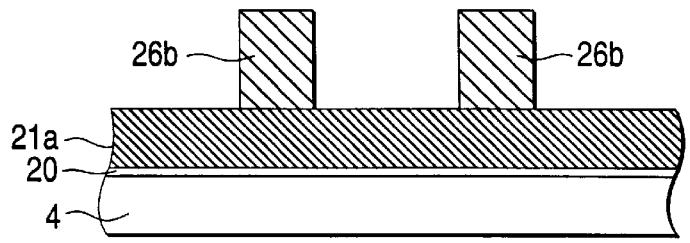

Thereafter, as indicated in FIG. 27, a negative type resist film 26a is further coated on the upper layer, and then the KrF excimer laser 11b with the exposure energy of 35 mj/cm$^2$ is irradiated thereon via the reticle 23 shown in FIG. 25 so as to perform the exposing process. At this time, the exposure energy is lower than the intensity under which all of the patterns drawn on the reticle 23 can be exposed. As a result, the shape of the contact hole pattern 24 is made in such a manner that energy acquired into the negative type resist film 26a is low due to the diffraction phenomenon, and the contact hole pattern 24 is formed. Accordingly, after the developing process has been executed, as indicated in FIG. 28, a resist pattern 26b corresponding to the wiring pattern 25a within the reticle 23 is formed as shown in FIG. 28.

Figure 29:
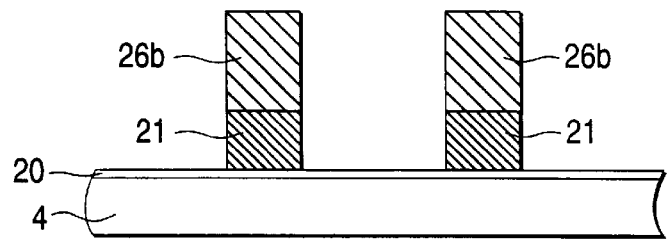

Next, as shown in FIG. 29, while using the resist pattern 26b as an etching mask, the anisotropic etching process is carried out with respect to the polysilicon film 21a to thereby form the wiring line 21. Thereafter, the resist pattern 26b is removed by employing the oxygen plasma ashing method and the like.

Figure 30:
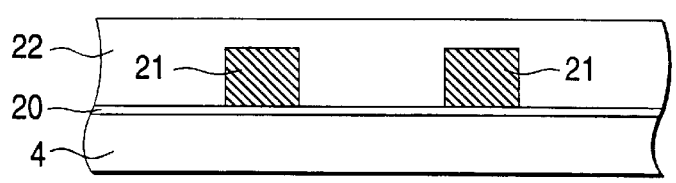

Thereafter, as illustrated in FIG. 30, a silicon oxide film having a thickness of on the order of 5000 Å is stacked to thereby form the interlayer insulating film 22.

Figure 31:
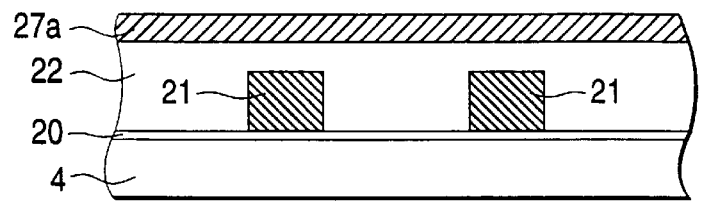

In addition, as shown in FIG. 31, a silicon nitride film 27a having a thickness of on the order of 500 to 1000 Å is formed on the surface of the interlayer insulating film 22.

Figure 32:
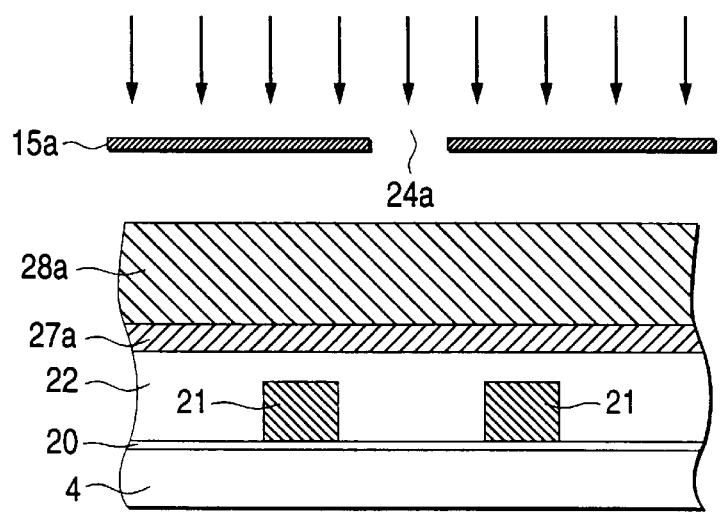
Figure 33:
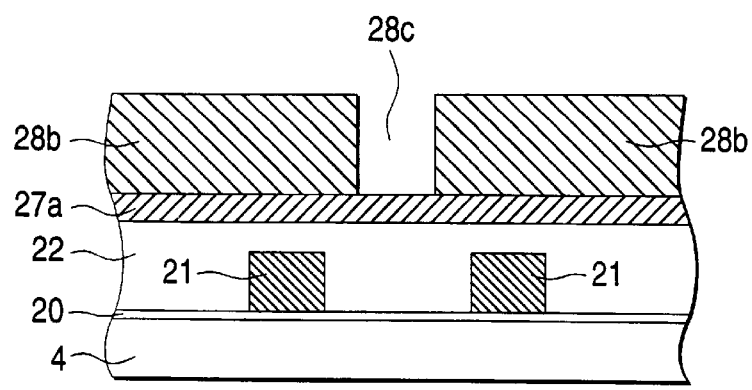

Next, as shown in FIG. 32, the commercially available positive type resist film 28a having a thickness of on the order of 6000 Å is coated on the silicon nitride film 27a. The photolithography is carried out via a second reticle 15a at a position corresponding to the contact hole pattern 24 formed on the reticle 23, so that a resist pattern 28b for constituting an opening portion 28c shown in FIG. 33 is formed. This contact hole pattern 24a owns a larger dimension than that of the contact hole pattern 24.

Figure 34:
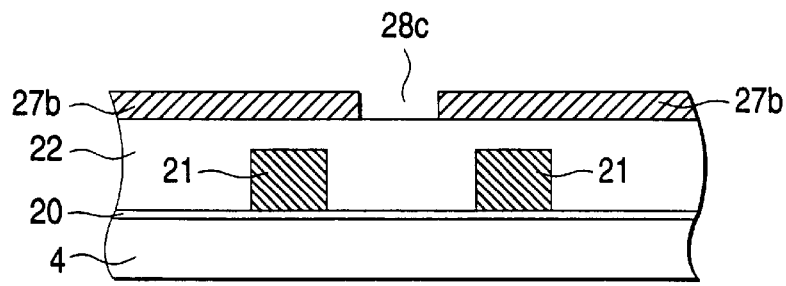

Thereafter, as shown in FIG. 34, while using the resist pattern 28b as an etching mask, the anisotropic etching process is carried out with respect to the silicon nitride film 27a so as to further dig opening portion 28c, and a nitride film pattern 27b is formed, and then the resist pattern 28b is removed.

Figure 35:
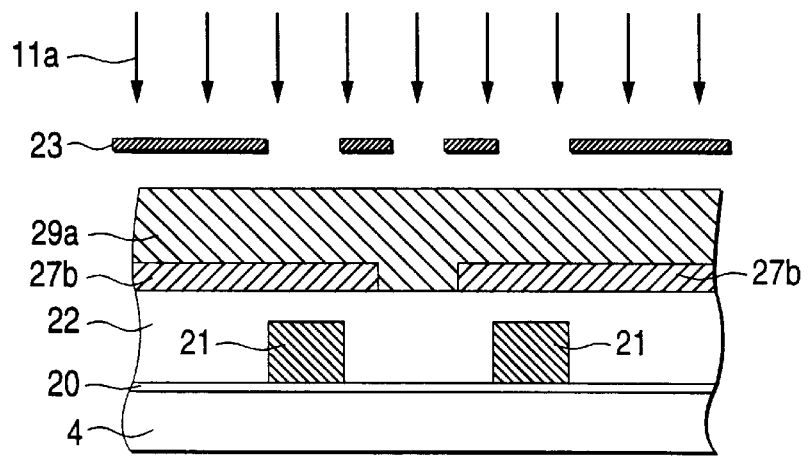

Next, as indicated in FIG. 35, a positive type resist film 29a is coated on the surface, and the exposing process is performed via the same reticle 23 as that employed in the exposing process at the manufacturing step of FIG. 27 by employing the KrF excimer laser having the exposure energy of 60 mj/cm$^2$.

Since the exposure energy is 60 mj/cm$^2$, namely high in this case, all of the patterns drawn on the reticle 23 can be transferred to the positive type resist film 29a.

Figure 36:
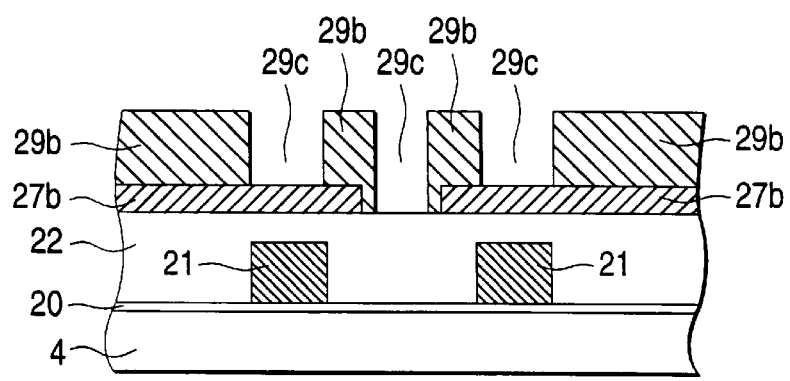

Thereafter, as shown in FIG. 36, since the developing process is performed, the resist of the exposed portion is removed to form an opening portion 29c, so that a resist pattern 29b is formed.

Figure 37:
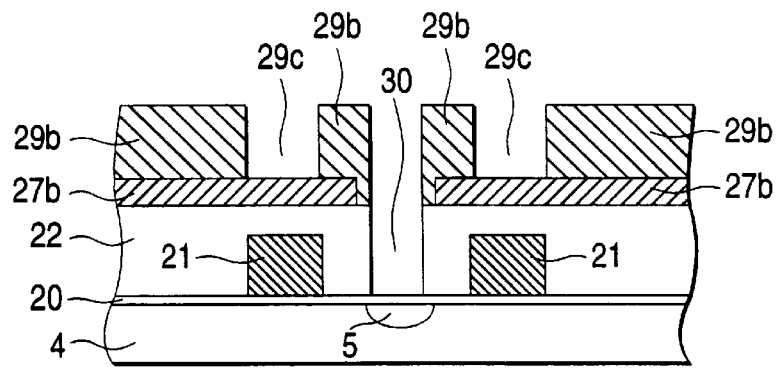

Furthermore, as indicated in FIG. 37, while using the resist pattern 29b as an etching mask, the anisotropic etching process is performed with respect to the interlayer insulating film 22 to thereby form an opening portion 30 which is dug up to the surface of the silicon oxide film 20. At this time, as to the opening portion 29c where the nitride film pattern 27b is formed on the lower portion thereof, the nitride film pattern 27b may function as an etching stopper film, so that the opening portion 29c is not further dug. Thereafter, the active region 5 is formed in the lower portion of the opening portion 30 by implanting the impurity and the like. It should also be noted that this active region 5 may be formed in other steps.

Figure 38:
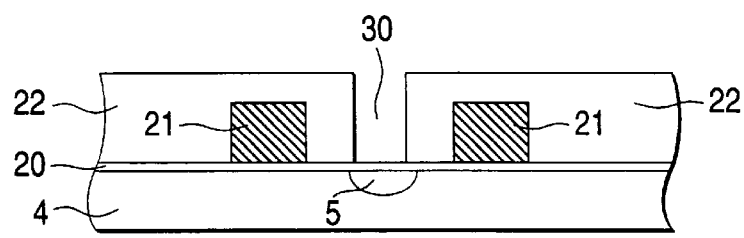

Next, as shown in FIG. 38, the resist pattern 29b and the nitride film pattern 27b are sequentially removed to thereby expose the surface of the interlayer insulating film 22.

Figure 39:
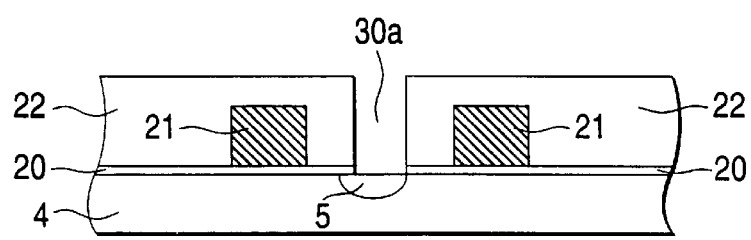

Furthermore, as indicated in FIG. 39, the silicon oxide film 20 located at the bottom surface of the opening portion 30 is etched to be removed, so that the surface of the semiconductor substrate 4 (active region 5) and a contact hole 30a is formed.

Figure 40:
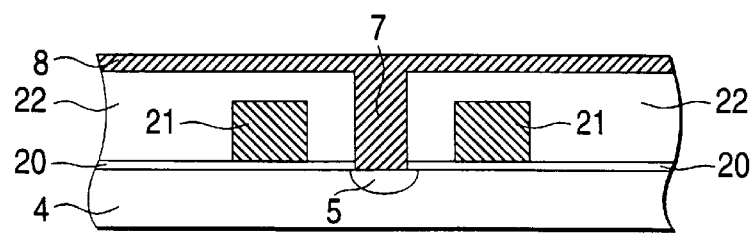

Thereafter, as illustrated in FIG. 40, the metal wiring material 8 having a thickness of on the order of 1000 Å is stacked by way of the sputtering method, or the CVD method, and this metal wiring material 8 also fills this contact hole 30a.

Next, a similar process operation to those of the second embodiment shown in FIG. 21 to FIG. 23 is carried out by employing the reticle 23, so that a semiconductor device having a structure can be manufactured which is indicated as a sectional view of FIG. 24.

Also, in the semiconductor device manufactured in this manner, the wiring line (under layer wiring line) 21 can be patterned, the contact 7 can be formed, and the wiring patterns 8a and 8b can be formed by selectively patterning the metal wiring material 8 whose entire surface is stacked by using only one piece of the exposing reticle 23 required when the alignment is performed in essentially high precision. As a consequence, it is possible to avoid the alignment error caused by manufacturing the reticle, as compared with such a case that one sheet of reticle on which one sort of pattern is formed is employed.

Also, a total number of reticles used in manufacturing of the semiconductor device can be reduced, as compared with the prior art, so that there is a feature such that the manufacturing cost can be lowered.

Fourth Embodiment

Figure 41:
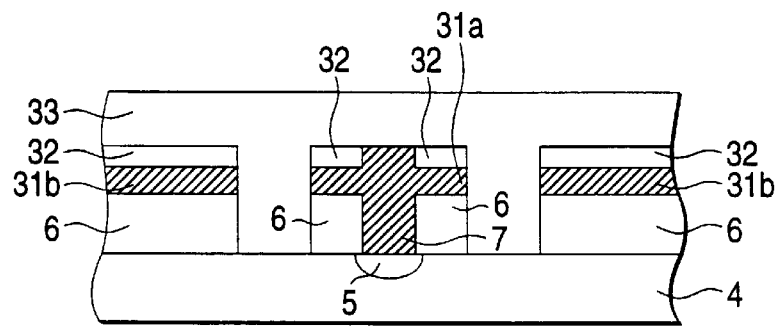
FIG. 41 is a sectional view for schematically representing a semiconductor device according to a fourth embodiment of the present invention.

Then, a description will now be made of a semiconductor device manufacturing method according to a fourth embodiment of the present invention. A structure of the semiconductor device manufactured by this fourth embodiment is indicated in FIG. 41. That is, an active region 5 is formed in a surface of a semiconductor substrate 4, and a contact 7 is formed on this active region 5, and also a wiring line 31a is formed under such a condition that this wiring line 31a is made in contact with the upper portion of this contact 7. Another wiring line 31b is formed via an insulating film 6 stacked on the semiconductor substrate 4 at the same height as the first-mentioned wiring line 31a. Furthermore, an interlayer insulating film 32 is formed on these wiring lines 31a and 31b, and another interlayer insulating film 33 is formed under such a condition that this insulating film 33 is stacked on the wiring lines 31a and 31b and is buried between these wiring lines 31a and 31b. The contact 7 is formed in such a manner that this contact 7 is projected from the wiring line 31a upwardly.

Subsequently, a method for manufacturing the semiconductor device shown in FIG. 41 will now be explained.

Figure 42:
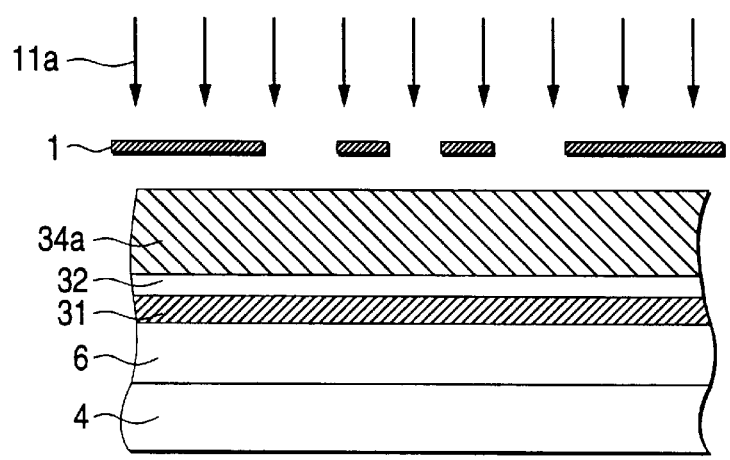
FIGS. 42 to 50 show manufacturing stage diagrams of the semiconductor device according to the fourth embodiment of the present invention.

First, as indicated in FIG. 42, the interlayer insulating film 6 made of a silicon oxide film having a thickness of on the order of 5000 Å is stacked on the semiconductor substrate 4, and furthermore, a tungsten silicide film 31 having a thickness of on the order of 1000 Å is stacked thereon. Moreover, a silicon oxide film having a film thickness of on the order of 1000 Å is stacked thereon, which will constitute the interlayer insulating film 32, and then a positive type resist film 34a having a thickness of on the order of 6000 Å is coated on the surface of this stacked silicon oxide film, to which the KrF excimer laser 11a with the exposure energy of 60 mj/cm$^2$ is irradiated via the reticle 1 shown in FIG. 1. Thus, the positive type resist film 34a is selectively photosensed.

Figure 43:
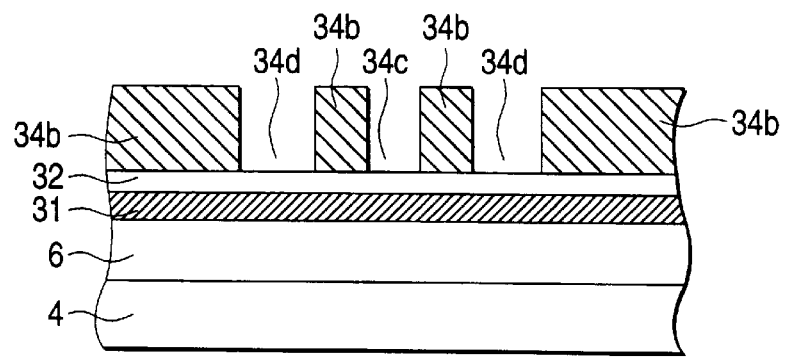

Thereafter, as indicated in FIG. 43, the developing process is carried out with respect to the positive type resist film 34a, and then only the photosensed portion thereof is removed to thereby form opening portion 34c and 34d. As a result, a resist pattern 34b drawn on the reticle 1 is obtained.

Figure 44:
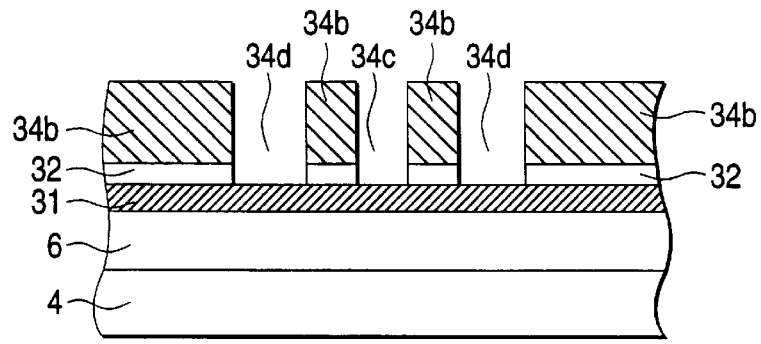

Next, as indicated in FIG. 44, while using the resist pattern 34b as an etching mask, the anisotropic etching process is carried out to the interlayer insulating film 32, so that bottom surfaces of the opening portions 34c and 34d of the portions corresponding to the contact hole pattern 2 of the reticle 1 and the opening portion 3c are further dug.

Figure 45:
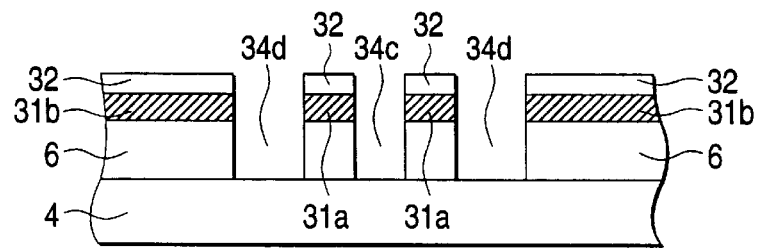

Thereafter, as represented in FIG. 45, while employing the resist pattern 34b as an etching mask, the anisotropic etching processes are successively performed with respect to the tungsten silicide film 31 and the interlayer insulating film 6. As a result, the tungsten silicide film 31 is patterned to the wiring lines 31a and 31b, and then the semiconductor substrate 1 is exposed from the bottoms of the opening portions 34c and 34d. At this manufacturing stage, the opening portion 34c becomes the contact hole. Thereafter, the resist pattern 34b is removed by way of the oxygen plasma ashing method and so on.

Next, a resist pattern for covering a region other than the opening portion 34c is formed, and an impurity ion is implanted, so that the active region 5 is formed on the surface of the semiconductor substrate 4. Thereafter, the resist pattern is removed. Alternatively, there is no problem when this active region 5 is formed in other manufacturing stages.

Figure 46:
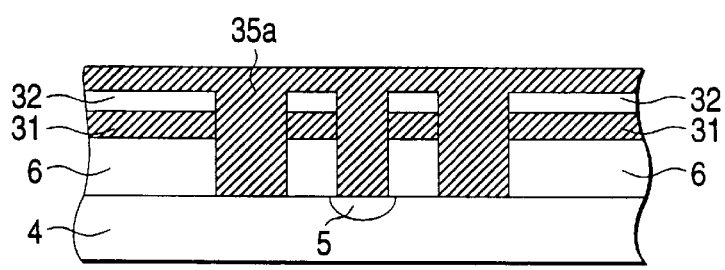

Furthermore, as indicated in FIG. 46, a conductive substance such as a tungsten silicide film 35a having a thickness of on the order of 2000 Å is stacked by way of either the sputtering method or the CVD method, and then the opening portions 34c and 34d are filled with this conductive substance.

Figure 47:
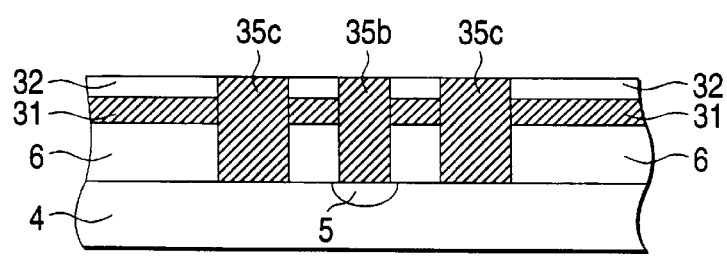

Next, as indicated in FIG. 47, the entire surface of the tungsten silicide film 35a is etched back, so that a portion located in the upper layer from the interlayer insulating film 32 is removed, and then only such conductive substances of the portions buried in the opening portions 34c and 34d are left. In this case, the tungsten silicide film 35b is filled in the opening portion 34c, and the tungsten silicide film 35c is filled in the opening portion 34c.

Figure 48:
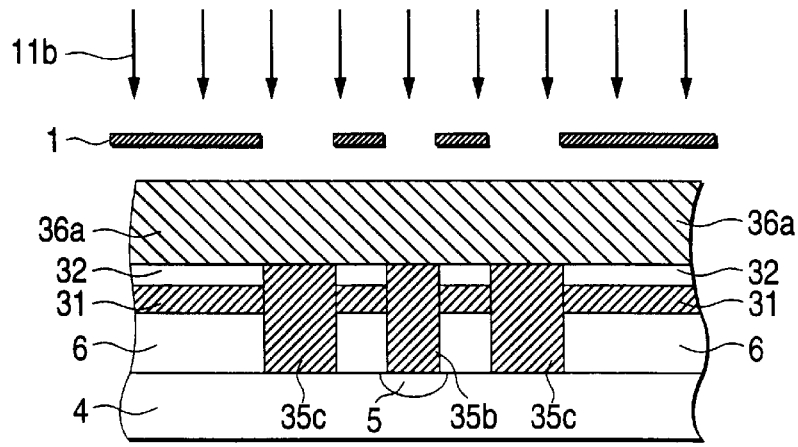

Thereafter, as indicated in FIG. 48, a positive resist film 36a is coated, and then the KrF excimer laser 11b with the exposure energy of 35 mj/cm$^2$ is irradiated thereon via the same reticle 1 as the above-described reticle 1 employed in the manufacturing stage of FIG. 42 so as to expose the positive type resist film 36a. In this exposing process, the contact hole pattern 2 in the reticle 1 is not formed due to a lack of exposed light intensity, so that only a portion corresponding to the opening portion 3c is formed.

Figure 49:
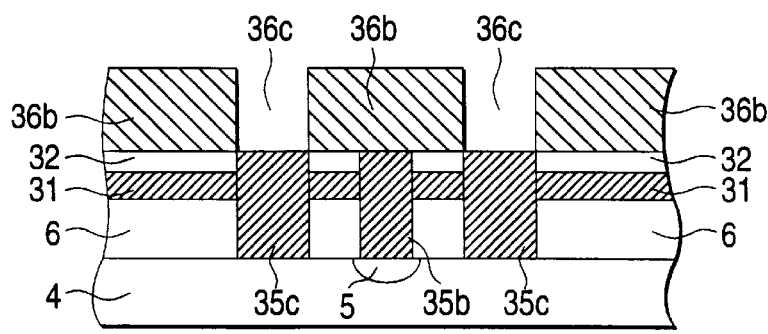

Next, as shown in FIG. 49, the developing process is carried out, so that only the photosensed portion among the positive type resist film 36a is removed and the opening portion 36c on the tungsten silicide film 35c is formed to thereby obtain a resist pattern 36b.

Figure 50:
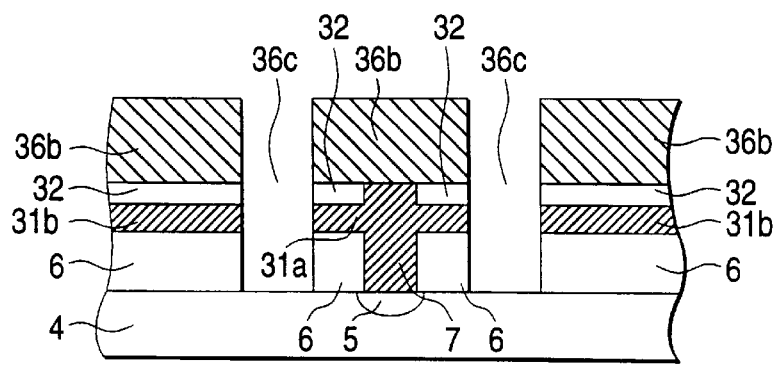

Next, as shown FIG. 50, while using the resist pattern 36b as an etching mask, the anisotropic etching process is carried, so that such a portion is removed which does not constitute the contact 7 within the stacked tungsten silicide film 35a at the manufacturing stage of FIG. 46, and the opening portion 36c is further dug to thereby expose the surface of the semiconductor substrate 4. Thereafter, the resist pattern 36b is removed.

Thereafter, the silicon oxide film having a thickness of on the order of 4000 Å is stacked by way of the sputtering method or the CVD method, and at this time, this insulating film is filled into the opening portion 36c. As a result, it is possible to manufacture the semiconductor device having the sectional structure as indicated in FIG. 41.

As previously explained, since the exposure energy is varied by using the same reticle 1, several different sorts of resist patterns can be manufactured. Also, only the reticle 1 may essentially give the great influences to the wiring lines and patterning of the contact holes. Since the exposing process is carried out by employing the same reticle, it is possible to suppress occurrences of the alignment errors caused by the erroneous manufacture of the mask.

Furthermore, since a total number of the reticles required to manufacture the semiconductor device can be reduced, there is such a feature that the manufacturing cost can be reduced.

Fifth Embodiment

Figure 51:
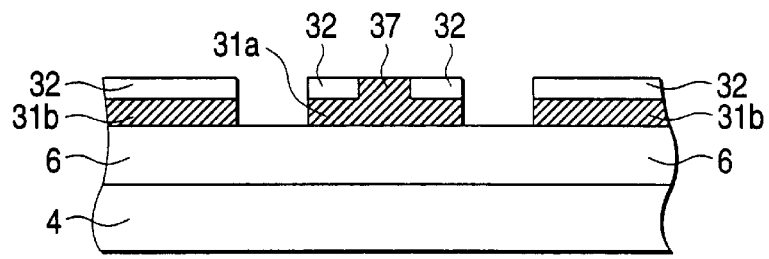
FIG. 51 is a sectional view for schematically representing a semiconductor device according to a fifth embodiment of the present invention.

Then, a description will now be made of a semiconductor device manufacturing method according to a fifth embodiment of the present invention. FIG. 51 is a sectional view for showing a semiconductor device manufactured in accordance with this fifth embodiment. In this drawing, wiring lines 31a and 31b are formed in such a manner that these wiring lines 31 and 31b are separated from each other via an insulating film 6 on a semiconductor substrate 4, and a projection portion of an upper portion of the wiring line 31a is a through hole portion 37. Also, an insulating film 32 is stacked on the upper surfaces of the wiring lines 31a and 31b in such a manner that this insulating film 32 is stacked up to a height where the through hole portion 37 is buried.

In the semiconductor device having such a structure, an upper layer wiring line electrically connected to the through hole portion 37 is formed at the subsequent manufacturing stages, but no further explanation thereof is made.

Next, a method for manufacturing the semiconductor device with the sectional structure shown in FIG. 51 will now be explained.

A processing operation is first carried out in a similar manner to these of the fourth embodiment shown in FIG. 42 to FIG. 44, so that an insulating film 6, a tungsten silicide film 31, and an interlayer insulating film 32 are sequentially stacked on the semiconductor substrate 4. Furthermore, while using a resist pattern 34b corresponding to a light shielding portion of the reticle 1 as an etching mask, the anisotropic etching process is carried out with respect to the interlayer insulating film 32 to pattern the interlayer insulating film 32 to have the same shape as the resist pattern 34b.

Figure 52:
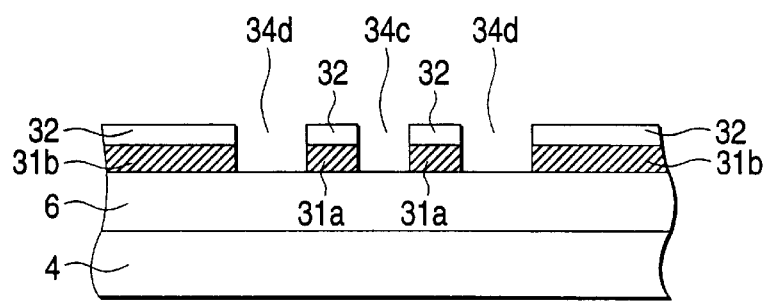
FIGS. 52 to 57 shows manufacturing stage diagrams of the semiconductor device according to the fifth embodiment of the present invention.

Next, as indicated in FIG. 52, the resist pattern 34b is removed, and while using the patterned interlayer insulating film 32 as an etching mask, the anisotropic etching process is carried out with respect to the tungsten silicide film 31, as to further dig the opening portions 34c and 34d and also to pattern the wiring lines 31a and 31b.

Figure 53:
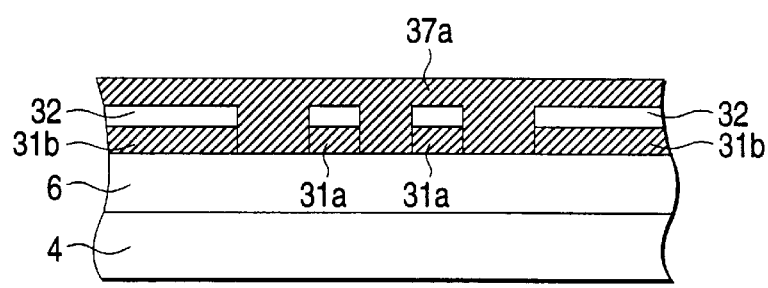

Thereafter, as shown in FIG. 53, a tungsten silicide film 37a having a thickness of on the order of 2000 Å is stacked by way of the sputtering method, or the CVD method.

Figure 54:
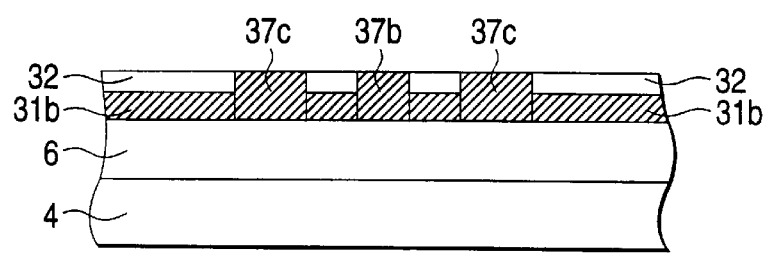

Subsequently, as illustrated in FIG. 54, the entire surface of the stacked film is etched back to thereby remove the upper portion of the tungsten silicide film 37a, so that the interlayer insulating film 32 is exposed, and the tungsten silicide films 37b and 37c are buried in the portions of the tungsten silicide film 37a, where the opening portions 34c and 34d are formed.

Figure 55:
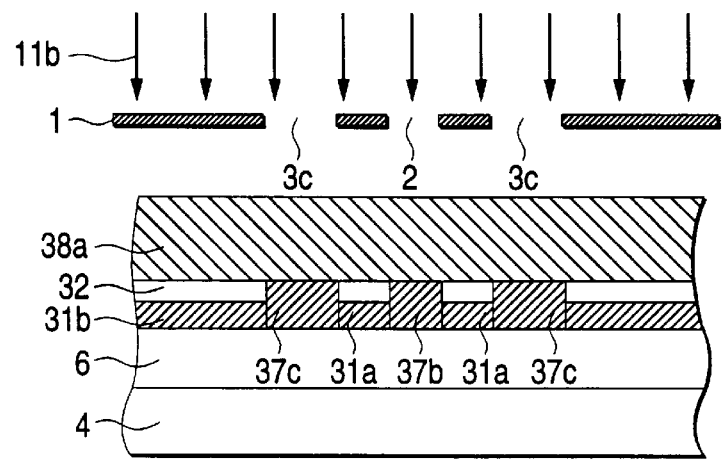
Figure 56:
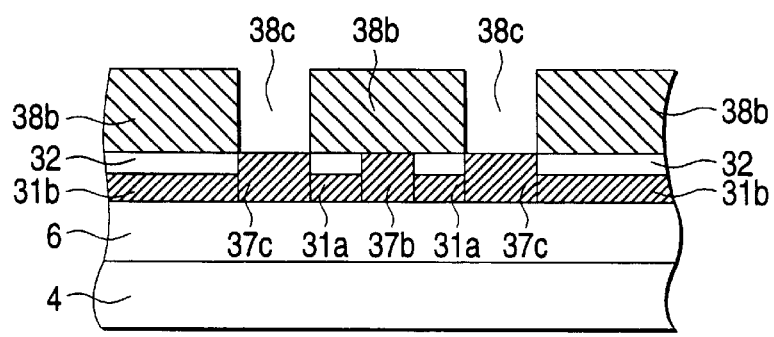

Next, as shown in FIG. 55, a positive resist film 38a is coated, to which the KrF excimer laser 11b with the exposure energy of 35 mj/cm$^2$ is irradiated through the same reticle as that used in the preceding stage so as to execute the exposing process. Under this exposure intensity, the resist corresponding to the contact hole pattern 2 having a relatively small pattern area is insufficiently photosensed, but only the resist portion corresponding to the opening portion 3c within the reticle 1 is photosensed.

Next, as indicated in FIG. 5b, the developing process is carried out so as to remove the positive type resist film 38a of the photosensed portion, so that an opening portion 38c is formed, and then a resist pattern 38b is obtained.

Figure 57:
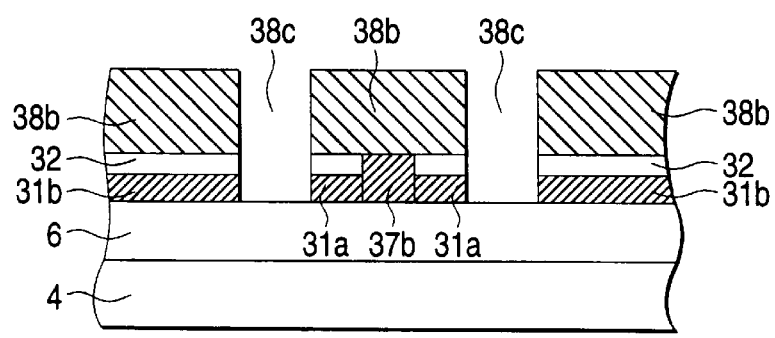
Figure 58A:
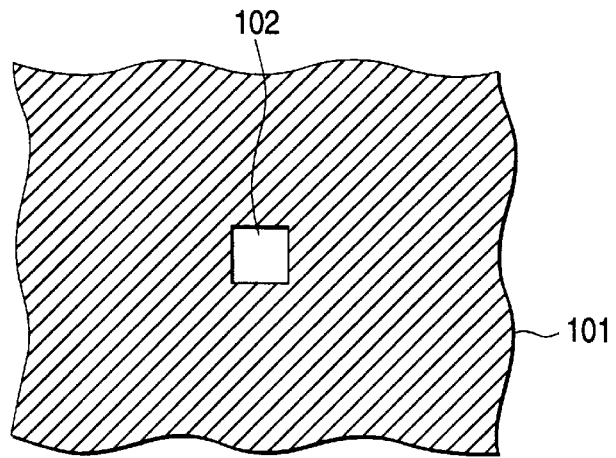
FIGS. 58A and 58B schematically indicate the reticles used in manufacturing of the conventional semiconductor device.
Figure 58B:
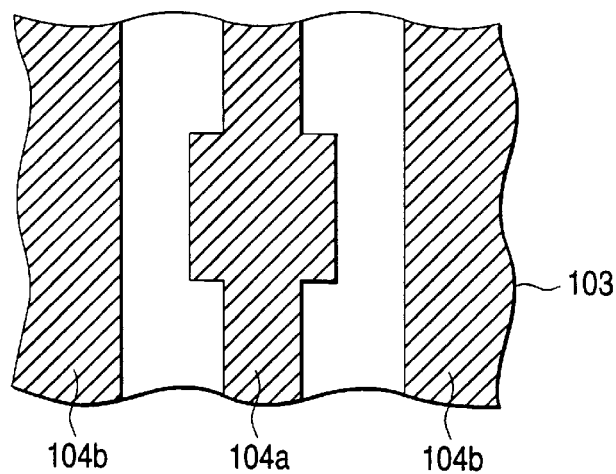
Figure 59:
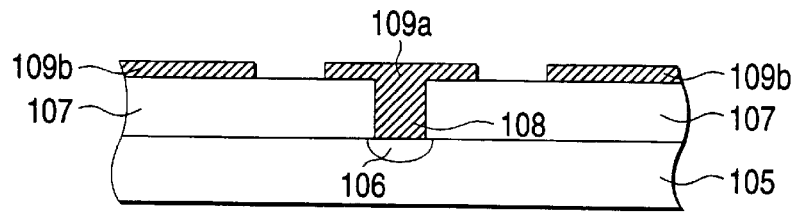
FIG. 59 is a sectional views for schematically representing the conventional semiconductor device.
Figure 60:
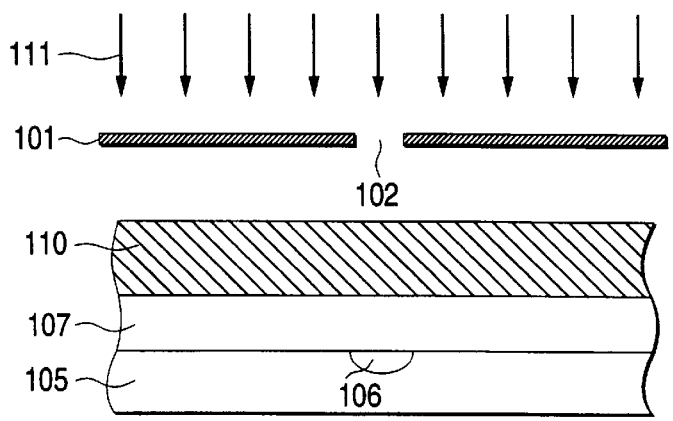
FIGS. 60 to 67 show manufacturing stage diagrams of the conventional semiconductor device.
Figure 61:
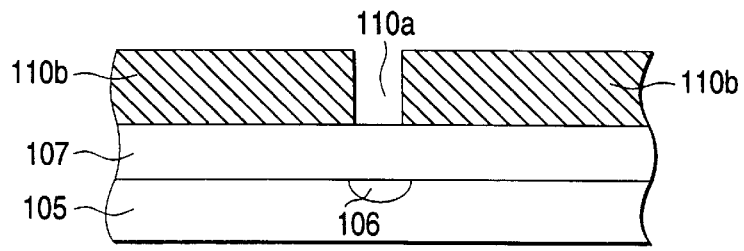
Figure 62:
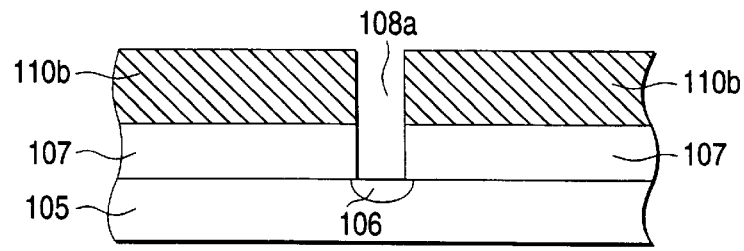
Figure 63:
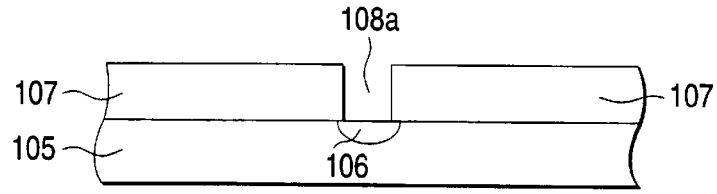
Figure 64:
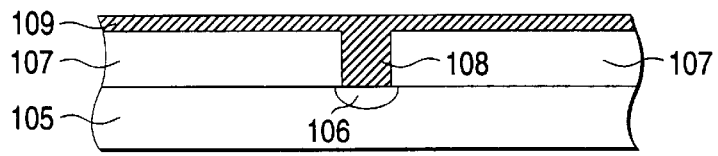
Figure 65:
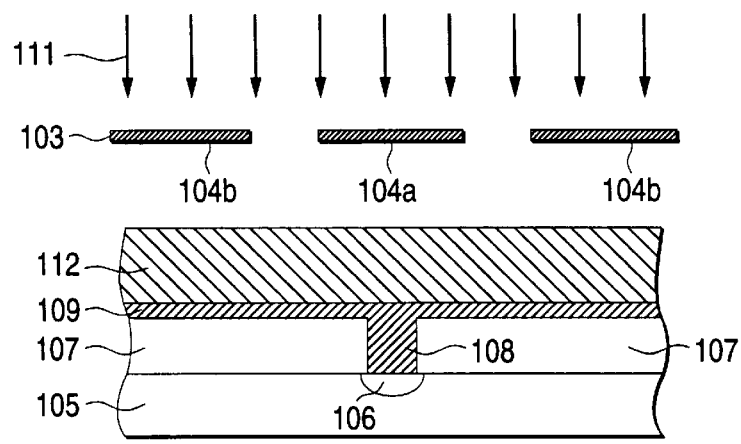
Figure 66:
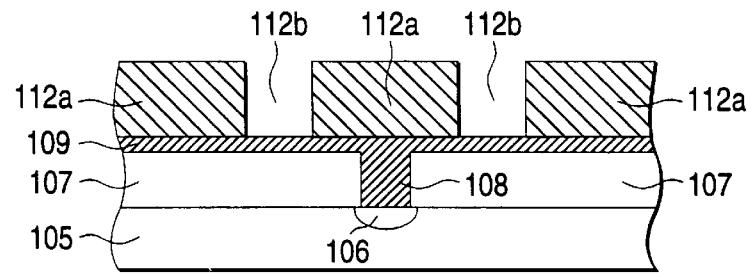
Figure 67:
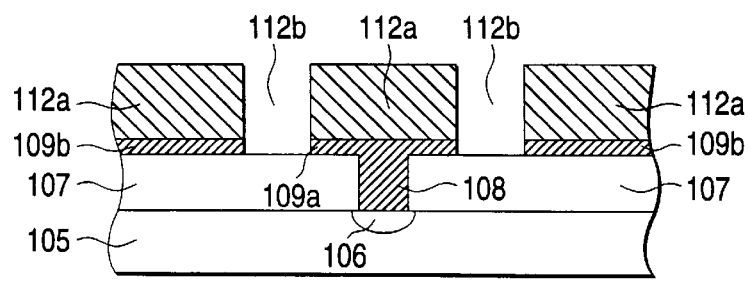
Figure 68:
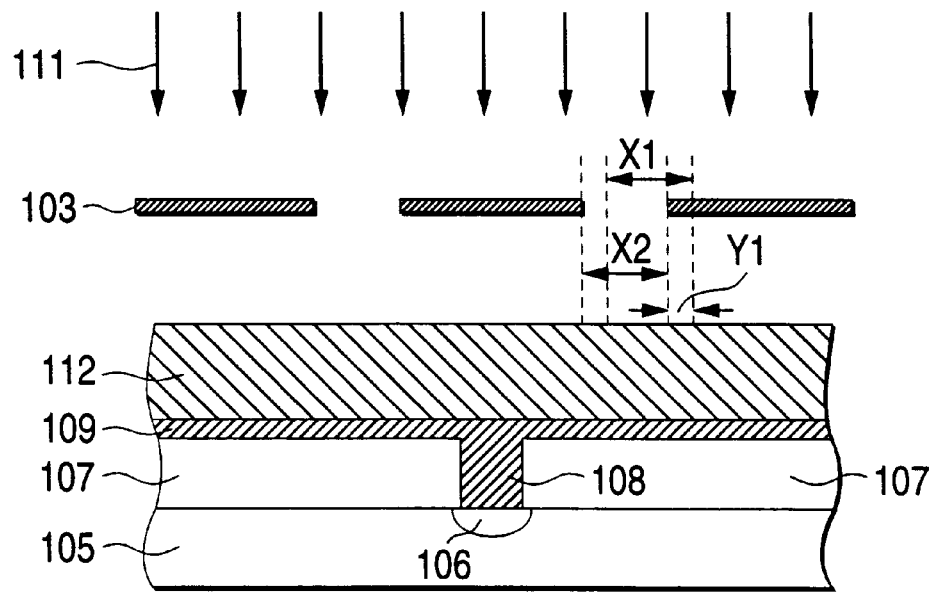
FIGS. 68 and 69 are sectional views for schematically indicating the conventional semiconductor device.
Figure 69:
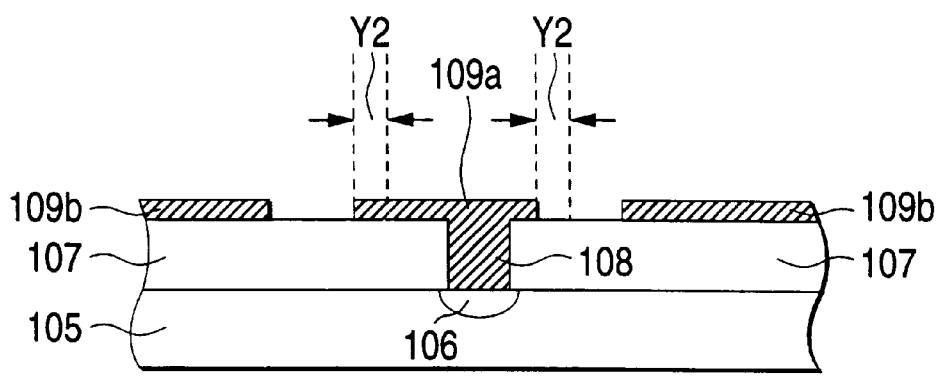

Next, as indicated in FIG. 57, while using the resist pattern 38b as an etching mask, the anisotropic etching process is performed with respect to the tungsten silicide film 37c in order to remove this tungsten silicide film 37c, and then the opening portion 38c is further dug. As a result, the wiring lines 31a and 31b are mutually separated from each other. In FIG. 51, there are shown the wiring line 31a contains the tungsten silicide film 37b, and the upper portion of the tungsten silicide film 37b is expressed as the through hole portion 37.

Thereafter, the resist pattern 38b is removed, so that the semiconductor device having such a structure as shown in FIG. 51 can be manufactured.

In accordance with the above-described method for manufacturing the semiconductor device, the wiring lines 31a, 31b, and the through hole portion 37 can be patterned by employing one sheet of the above-mentioned reticle 1. Since one sheet of reticle is not required to be employed so as to form one sort of pattern, the alignment precision caused by the erroneous manufacturing of the mask can be increased. However, since a total number of reticles can be reduced as compared with that of the prior art, there is an advantage that the manufacturing cost can be reduced.

Sixth Embodiment

As previously described, in accordance with the first to fifth embodiments, two sorts of patterns, namely the contact hole (alternatively, through hole portion) pattern and the wiring pattern are drawn on one sheet of the reticle. Also, the upper layer/lower layer wiring lines and the contact hole pattern are drawn on one sheet of the reticle. Alternatively, it is also possible to employ such a reticle on which other shaped patterns are drawn in manufacturing of the semiconductor device.

As an example where a plurality of patterns are formed on one sheet of a reticle, there are three sorts of combined patterns, namely the wiring pattern, the hole pattern formed in the memory cell, and the hole pattern formed outside the memory cell. Concretely speaking, there are a storage node of a capacitor for constituting a memory cell of a DRAM, a contact hole for filling a storage node contact therein, and a contact hole for filling therein an aluminum wiring contact formed outside the memory cell.

For instance, in the case that only the hall pattern is formed inside the memory cell, a stopper film corresponding to the nitride film pattern 14b indicated in FIG. 13 to FIG. 15 of the second embodiment is formed in a region outside the memory cell, and then only the region within the memory cell should be etched away (patterned). Thereafter, a resist film is coated, and the photolithography is carried out by employing a reticle on which three sorts of patterns are formed, so that resist patterns having shapes corresponding to all of the patterns formed on this reticle are formed. Thereafter, when the etching process is carried out by using the formed resist patterns, since the region where the stopper film is formed cannot be etched away, the patterning process can be performed while using the resist pattern formed only the region to be etched away as an etching mask.

In such a case that the wiring pattern has been formed within the region corresponding to the memory cell region of the reticle at the stage where the resist pattern was formed, the pattern corresponding to this mask pattern is patterned at the same time. However, it is possible to obtain only the required hole pattern within the memory cell be executing the following processes. That is, the portions unwontedly patterned in accordance with the method as previously explained in the first embodiment (in this case, wiring pattern) is selectively removed. Otherwise, if there is an unnecessary opening portion, then the insulating substance is filled.

When a large number of mask patterns are formed in the same reticle in accordance with the above-described manner, since this reticle may be utilized plural times, the alignment precision can be increased. Conversely, although unnecessary resist patterns are formed, this problem may be solved by employing such a method for preventing the unnecessary etching treatment, for example, selectively forming a stopper film on the region such that no patterning is required on the etched film in accordance with the manufacturing stage.

As described above, since such a method is employed in which the stopper films are selectively arranged so as to separate the patterning region from the non-patterning region, even when a large sort of patterns are formed on one sheet of the reticle and this reticle is employed, only patterns to be formed can be processed. As a consequence, one sheet of the reticle can be employed during several stages of the photolithography. Thus, there is an effect that the alignment shifts caused by the reticle manufacturing errors can be suppressed.

In accordance with the method for manufacturing the semiconductor device according to the present invention, since one sheet of such a reticle on which a plurality of different patterns have been formed is used plural times to manufacture the semiconductor device, there is an advantage that the alignment precision caused by the reticle (photomask) manufacturing error can be increased.

Also, in accordance with the method for manufacturing the semiconductor device according to the present invention, since one sheet of such a reticle on which a plurality of different patterns have been formed is used plural times to manufacture the semiconductor device, there is an advantage that the alignment precision caused by the reticle manufacturing error can be increased. There is another advantage that since a total number of reticles employed in manufacturing of the semiconductor device may be reduced, the manufacturing cost can be reduced.

Furthermore, in accordance with the method for manufacturing the semiconductor device according to the present invention, since one sheet of such a reticle on which a plurality of different patterns have been formed is used plural times to manufacture the semiconductor device, there is an advantage that the alignment precision caused by the reticle manufacturing error can be increased.

Also, in accordance with the method for manufacturing the semiconductor device according to the present invention, since one sheet of such a reticle on which a plurality of different patterns have been formed is used plural times to manufacture the semiconductor device, there is an advantage that the alignment precision caused by the reticle (photomask) manufacturing error can be increased. Further, the sort of the reticle used in the photolithography is selected, so that, for instance, the light shielding portion of the reticle and the opening portion can be utilized as the wiring patterns.

In addition, in accordance with the method for manufacturing the semiconductor device according to the present invention, since one sheet of such a reticle on which a plurality of different patterns have been formed is used plural times to manufacture the semiconductor device, there is an advantage that the reticle manufacturing error can be prevented and the alignment precision can be increased.

Also, in accordance with the method for manufacturing the semiconductor device according to the present invention, since one sheet of such a reticle on which a plurality of different patterns have been formed is used plural times to manufacture the semiconductor device, there is an advantage that the reticle manufacturing error can be prevented and the alignment precision can be increased.

Moreover, according to the method for manufacturing the semiconductor device of the present invention, as to the region which is not required to be patterned, the stopper film is selectively formed on this region so as to avoid the etching process. Only the region which is required to be patterned is processed. As a result, it is possible to manufacture the semiconductor device with employment of the reticle on which large sorts of patterns are formed. As a consequence, since the manufacturing stages with employment of the same reticle are increased, there is a further advantage that the alignment precision can be increased.

Also, according to the method for manufacturing the semiconductor device of the present invention, the hole pattern as the first opening pattern, and the wiring pattern as the second opening pattern are formed on the same reticle, and this reticle is employed to manufacture the semiconductor device. Accordingly, for example, after the hole pattern has been formed, the conductive substance is filled therein to form the contact. Then, when the wiring line electrically connected to the upper surface of this contact is formed by reflecting the wiring pattern, the occurrence of the pattern shifts caused by the alignment shifts by the reticle manufacturing errors for the contact and the wiring pattern can be suppressed, so that the semiconductor device with high precision can be obtained.

Furthermore, in accordance with the method for manufacturing the semiconductor device of the present invention, the processing region is determined by selectively forming the stopper films, and the desired region is patterned. Accordingly, one sheet of such a reticle on which large sorts of patterns are formed is used plural times, so that the photolithography can be done. As a consequence, there is an advantage that the alignment precision caused by the reticle manufacturing error can be increased.

What is claimed is:

1. A method for manufacturing a semiconductor device comprising the steps of:

exposing a resist film by irradiating exposure ray onto a resist film coated on a substrate to be etched via a photomask on which at least a first opening pattern and a second opening pattern are formed;

developing said resist film to thereby obtain a resist pattern;

etching said substrate while using said resist pattern as an etching mask to thereby obtain a predetermined pattern; and removing said resist pattern;

wherein when said exposure ray has first exposure intensity said predetermined pattern obtained is a pattern corresponding to said first opening pattern and a pattern corresponding to said second opening pattern; and when said exposure ray has second exposure intensity, said predetermined pattern obtained is only a pattern corresponding to said second opening pattern.

2. A method for manufacturing a semiconductor device as claimed in claim 1, wherein said exposing step includes a step of irradiating exposure ray with said first exposure intensity onto a first positive resist film coated via an interlayer insulating film on the semiconductor substrate, said exposure ray being irradiated via a photomask on which at least a first opening pattern and a second opening pattern having a larger area than that of said first opening pattern are formed;

said developing step includes a step of developing said first positive resist film to thereby obtain a first resist pattern on which a first opening portion corresponding to said first opening pattern, and a second opening pattern corresponding to said second opening pattern are formed;

said etching step includes a first anisotropic etching process with respect to said interlayer insulating film while using said first resist pattern as an etching mask so as to dig at least a bottom surface of said first opening portion corresponding to said first opening pattern and a bottom surface of said second opening portion corresponding to said second opening pattern to thereby expose a portion of said semiconductor substrate;

said removing step includes a step of removing said first positive resist film;

said manufacturing method further comprising the steps of:

stacking a conductive substance having a predetermined film thickness on said interlayer insulating film and also burying said conductive substance within said first opening portion to thereby form a contact;

exposing exposure ray with second exposure intensity onto a second positive type resist film stacked on said conductive material via said photomask;

developing said second positive resist film to thereby obtain a second resist pattern on which a second opening portion corresponding to said second opening pattern is formed;

executing an isotropic etching process while using said second resist pattern as an etching mask so as to remove said conductive substance positioned on and inside said second opening portion formed within said interlayer insulating film; and removing said second resist pattern;

wherein said conductive substance on said finally obtained interlayer insulating film constitutes a wiring line.

3. A method for manufacturing a semiconductor device as claimed in claim 1, further comprising a step of sequentially stacking an interlayer insulating film, a stopper film having a predetermined opening portion, and a first positive resist film on a semiconductor substrate;

wherein said exposing step includes a step of irradiating exposure ray with first exposure intensity onto said first positive resist film via a photomask on which at least a first opening pattern and a second opening pattern having a larger area than that of said first opening pattern are formed;

said developing step includes a step of developing said first positive resist film to thereby obtain a first resist pattern on which a first opening portion corresponding to said first opening pattern and positioned above said predetermined opening portion, and a second opening pattern corresponding to said second opening pattern and positioned above said predetermined opening portion are formed;

said etching step includes a step of etching process with respect to said interlayer insulating film while using said first resist pattern and said stopper film as an etching mask so as to dig a bottom surface of said semiconductor substrate; and said removing step includes a step of removing said first resist pattern and said stopper film to thereby expose a surface of said interlayer insulating film;

said manufacturing method further comprising the steps of:

stacking a conductive substance having a predetermined film thickness on said interlayer insulating film and also burying said conductive substance within said first opening portion to thereby form a contact;

exposing exposure ray with second exposure intensity onto a second positive resist film coated on said conductive material via said photomask;

developing said second positive resist film to thereby obtain a second resist pattern on which a second opening portion corresponding to said second opening pattern is formed;

executing an isotropic etching process while using said second resist pattern as an etching mask with respect to said conductive substance; and removing said second resist pattern;

wherein said conductive substance on said finally obtained interlayer insulating film constitutes a wiring line.

4. A method for manufacturing a semiconductor device as claimed in claim 1 further comprising a step of sequentially stacking a first insulating film, a first conductive film, and a negative resist film on a semiconductor substrate;

wherein said exposing step includes a step of irradiating exposure ray with second exposure intensity onto said negative resist film via a photomask on which at least a first opening pattern and a second opening pattern having a larger area than that of said first opening pattern are formed;

said developing step includes a step of developing said negative resist film to thereby obtain a first resist pattern in which only a portion thereof corresponding to said second opening pattern is left;

said etching step includes an anisotropic etching process with respect to said first conductive film while using said first resist pattern as an etching mask to thereby form an underlayer wiring line; and said removing step includes a step of removing said first resist pattern;

said manufacturing method further comprising the steps of:

stacking a second insulating film having a predetermined film thickness on said first insulating film to thereby bury said underlayer wiring line into said second insulating film;

sequentially stacking a stopper film having a predetermined opening portion, and a first positive resist on said second insulating film;

irradiating exposure ray with first exposure intensity onto said first positive resist film via said photomask;

developing said first positive resist film to thereby form a second resist pattern on which a first opening portion located above said predetermined opening portion and corresponding to said first opening pattern, and also a second opening portion corresponding to said second opening pattern;

forming said second resist pattern; executing an anisotropic etching process while using said second resist pattern as an etching mask and employing said semiconductor substrate and said stopper film as an etching stopper so as to dig said first opening portion, whereby said semiconductor substrate is exposed to form a contact hole;

removing both said second resist pattern and said stopper film;

stacking a second conductive film with an arbitrary film thickness on said second insulating film and at the same time, burying said second conductive film into said contact hole to thereby form a contact;

coating a second positive type resist film on said second conductive film and irradiating said exposure ray with the second exposure intensity onto said second positive resist film via said photomask;

developing said second positive resist film to thereby form a third resist pattern on which said second opening portion corresponding to said second opening pattern is formed;

executing an anisotropic etching process with respect to said second conductive film while using said third resist pattern as an etching mask; and removing said third resist pattern;

wherein said finally obtained second conductive film constitutes a wiring line.

5. A method for manufacturing a semiconductor device as claimed in claim 1, further comprising a step of sequentially stacking a first insulating film, a first conductive film, a second insulating film and a first positive resist film on a semiconductor substrate;

wherein said exposing step includes a step of irradiating exposure ray with first exposure intensity onto said first positive resist film via a photomask on which at least a first opening pattern and a second opening pattern having a larger area than that of said first opening pattern are formed;

said developing step includes a step of developing said first positive resist film to thereby obtain a first resist pattern on which a first opening portion corresponding to said first opening pattern, and a second opening portion corresponding to said second opening pattern are formed;

said etching step includes an anisotropic etching process with respect to said second insulating film while using said first resist pattern as an etching mask to thereby pattern said second insulating film into the shape of said first resist pattern and, to dig said first and second opening portions; and said removing step includes a step of removing said first resist pattern;

said manufacturing method further comprising the steps of:

sequentially executing an isotropic etching process with respect to said first conductive film and said first insulating film, while using said second insulating film as an etching mask to thereby dig said first and second opening portions, whereby a portion of said semiconductor substrate is exposed;

stacking a second conductive film with a predetermined film thickness on said second insulating film and at the same time, burying said second conductive film into said contact hole to thereby form a contact;

etching away said second conductive film stacked on said second insulating film;

stacking a second positive resist film on said second insulating film;

irradiating said exposure ray with the second exposure intensity onto said second positive resist film via said photomask;

developing said second positive resist film to thereby form a second resist pattern on which a second opening portion corresponding to said second opening pattern is formed;

executing an anisotropic etching process while using said second resist pattern as an etching mask, and employing said semiconductor substrate as an etching stopper; and removing said second resist pattern;
wherein said finally obtained first conductive film constitutes a wiring line.

6. A method for manufacturing a semiconductor device as claimed in claim 1, further comprising a step of sequentially stacking a first insulating film, a first conductive film, a second insulating film, and a first positive resist film on a preselected substrate;

said exposing step includes a step of irradiating exposure ray with first exposure intensity onto said positive resist film via a photomask on which at least a first opening pattern and a second opening pattern having a larger area than that of said first opening pattern are formed;

said developing step includes a step of developing said first positive resist film to thereby obtain a first resist pattern in which a first opening portion corresponding to said first opening pattern and a second opening portion corresponding to said second opening pattern are formed;

said etching step includes an anisotropic etching process with respect to said second insulating film while using said first resist pattern as an etching mask to thereby pattern said second insulating film into a shape of said first resist pattern, whereby said first and second opening portions are dug; and said removing step includes a step of removing said first resist pattern;

said manufacturing method further comprising the steps of:

executing an isotropic etching process with respect to said first conductive film while using said second insulating film as an etching mask to thereby dig said first and second opening portions, whereby said first conductive film is patterned;

stacking a second conductive film with a predetermined film thickness on said second insulating film and at the same time, burying said second conductive film into said first opening portion to thereby form a through hole;

removing said second conductive film stacked on said second insulating film;

coating a second positive resist film on said second insulating film;

irradiating said exposure ray with the second exposure intensity onto said second positive resist film via said photomask;

developing said second positive resist film to thereby obtain a second resist pattern on which said second opening portion corresponding to said second opening pattern is formed;

executing an anisotropic etching process while using said second resist pattern as an etching mask and employing said first insulating film as an etching stopper; and removing said second resist pattern;

wherein said finally obtained first conductive film constitutes a wiring line.

7. A method for manufacturing a semiconductor device as claimed in claim 1, wherein said first opening pattern is a mask pattern used to form either a contact hole pattern or a through hole pattern; and said second opening pattern is another mask pattern used to form either a wiring pattern or a pattern corresponding to a space between adjoining wiring patterns.

8. A method for manufacturing a semiconductor device as claimed in claim 1, wherein said first exposure intensity is greater than the second exposure intensity.

9. A method for manufacturing a semiconductor device comprising the steps of:

forming a stopper film having an opening portion on an etching region on a substrate to be etched;

coating a resist film on said substrate to be etched;

irradiating exposure ray onto said resist film coated via a photomask on which at least a first opening pattern and a second opening pattern having a different dimension from that of said first opening pattern are formed to thereby expose said resist film;

developing said resist film to thereby obtain a resist pattern;

etching away said substrate while using said resist pattern as an etching mask to thereby obtain a predetermined pattern in said etching region; and removing said resist pattern and said stopper film; wherein:

when said exposure ray has first exposure intensity, said predetermined pattern obtained at said step is a pattern corresponding to said first opening pattern and a first pattern among patterns within said etching region, corresponding to said second opening pattern; and when said exposure ray has second exposure intensity, said predetermined pattern obtained at said step is only a second pattern corresponding to patterns located in said etching region, corresponding to said second opening pattern.

10. A method for manufacturing a semiconductor device as claimed in claim 9, wherein said first opening pattern includes a first hole pattern formed in a memory cell forming region within the semiconductor device, and a second hole pattern formed outside said memory cell forming region;

when a pattern corresponding to said first hole pattern is formed, a stopper film is formed in a region located outside said memory cell forming region in order that the region outside said memory cell forming region is not etched away; and when a pattern corresponding to said second hole pattern is formed, another stopper film is formed in the region within said memory cell region in order that the region located within said memory cell forming region is not etched away.

11. A method for manufacturing a semiconductor device as claimed in claim 9, wherein said first opening pattern is a mask pattern used to form either a contact hole pattern or a through hole pattern; and said second opening pattern is another mask pattern used to form either a wiring pattern or a pattern corresponding to a space between adjoining wiring patterns.

12. A method for manufacturing a semiconductor device as claimed in claim 9, wherein said first exposure intensity is greater than the second exposure intensity.

* * * * *